United States Patent
Caplow-Munro et al.

(10) Patent No.: US 11,917,780 B2
(45) Date of Patent: Feb. 27, 2024

(54) HINGED DEVICE WITH A FLEXIBLE DISPLAY

(71) Applicant: Microsoft Technology Licensing, LLC, Redmond, WA (US)

(72) Inventors: Devin Caplow-Munro, Seattle, WA (US); Denys Yaremenko, Carnation, WA (US); Brett Tomky, Seattle, WA (US); Luke Schwartzel, Bothell, WA (US); Anne Pirie, Peninsula, OH (US); Errol Mark Tazbaz, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/689,291

(22) Filed: Mar. 8, 2022

(65) Prior Publication Data
US 2023/0292455 A1   Sep. 14, 2023

(51) Int. Cl.
*H05K 5/00* (2006.01)
*H05K 5/02* (2006.01)
*F16C 11/04* (2006.01)

(52) U.S. Cl.
CPC ............ *H05K 5/0226* (2013.01); *F16C 11/04* (2013.01); *H05K 5/0017* (2013.01)

(58) Field of Classification Search
None
See application file for complete search history.

(56) References Cited

U.S. PATENT DOCUMENTS

| | | | |
|---|---|---|---|
| 7,474,525 B2 | 1/2009 | Watanabe et al. | |
| 9,348,450 B1* | 5/2016 | Kim | H04M 1/0268 |
| 10,761,572 B1* | 9/2020 | Siddiqui | G06F 1/1681 |
| 10,831,243 B2* | 11/2020 | Kim | G06F 1/1652 |
| 10,895,894 B2* | 1/2021 | Jan | G06F 1/1652 |
| 10,928,860 B2* | 2/2021 | Park | H04M 1/0218 |
| 11,240,920 B2* | 2/2022 | Jeon | H05K 5/0226 |

(Continued)

FOREIGN PATENT DOCUMENTS

| KR | 20190108668 A | 9/2019 |
|---|---|---|
| KR | 102299989 B1 | 9/2021 |
| WO | 2021133111 A1 | 7/2021 |

OTHER PUBLICATIONS

Ngo, Allen, "Dell Inspiron 13 7390 and 7590 2-in-1 have Magnetic "Pen Garages" for Housing the Stylus", Retrieved from: https://www.notebookcheck.net/Dell-Inspiron-13-7390-and-7590-2-in-1-have-magnetic-pen-garages-for-housing-the-stylus.422319.0.html, May 27, 2019, 4 Pages.

(Continued)

*Primary Examiner* — Anthony Q Edwards
*Assistant Examiner* — Rashen E Morrison
(74) *Attorney, Agent, or Firm* — Rainier Patents, P.S.

(57) ABSTRACT

The description relates to hinged devices. One example relates to a device that has a first portion hingedly secured along a spine and a second portion hingedly secured along the spine. The example can also include a first spine cover secured relative to the spine and extending into the first portion and a second spine cover secured relative to the spine and extending into the second portion. An extent to which the first spine cover extends into the first portion and the second spine cover extends into the second portion is controlled by an angular orientation of the first and second portions.

20 Claims, 17 Drawing Sheets

(56) References Cited

U.S. PATENT DOCUMENTS

| | | | | |
|---|---|---|---|---|
| 11,513,555 B2* | 11/2022 | Lee | ................. | H04M 1/0268 |
| 2011/0102979 A1 | 5/2011 | Jinkinson et al. | | |
| 2014/0042293 A1* | 2/2014 | Mok | ................. | H04M 1/0268 |
| | | | | 248/682 |
| 2015/0366089 A1* | 12/2015 | Park | ................. | G06F 1/1641 |
| | | | | 361/679.01 |
| 2020/0166972 A1 | 5/2020 | Park et al. | | |
| 2020/0225711 A1 | 7/2020 | Pelissier et al. | | |
| 2021/0056878 A1 | 2/2021 | Lee et al. | | |
| 2022/0137675 A1* | 5/2022 | Kuramochi | ........... | G06F 1/1641 |
| | | | | 361/679.27 |

OTHER PUBLICATIONS

"Invitation To Pay Additional Fees Issued in PCT Application No. PCT/US22/051336", dated Mar. 23, 2023, 14 Pages.

"International Search Report and Written Opinion Issued in PCT Application No. PCT/US22/051336", dated May 15, 2023, 21 Pages.

* cited by examiner

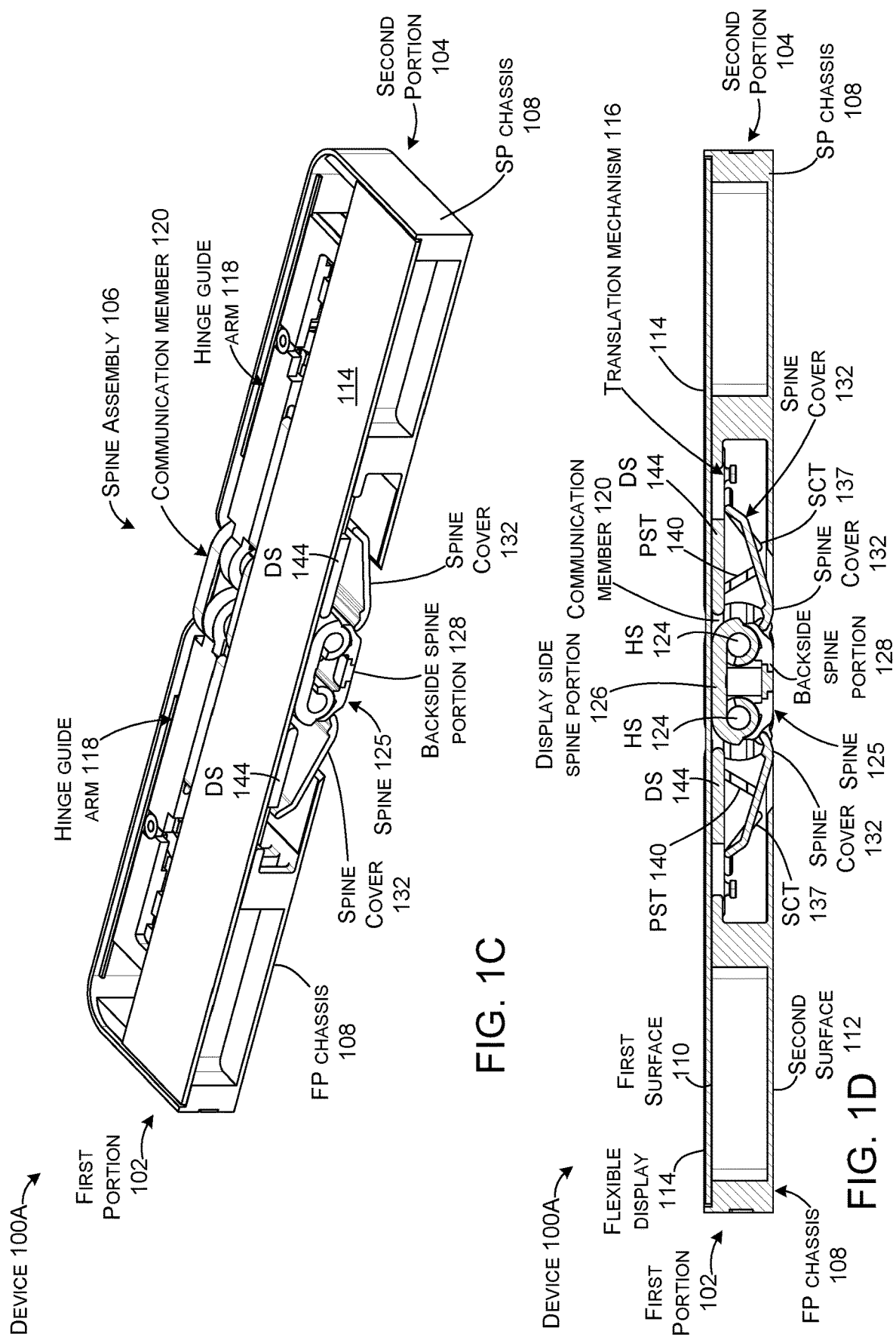

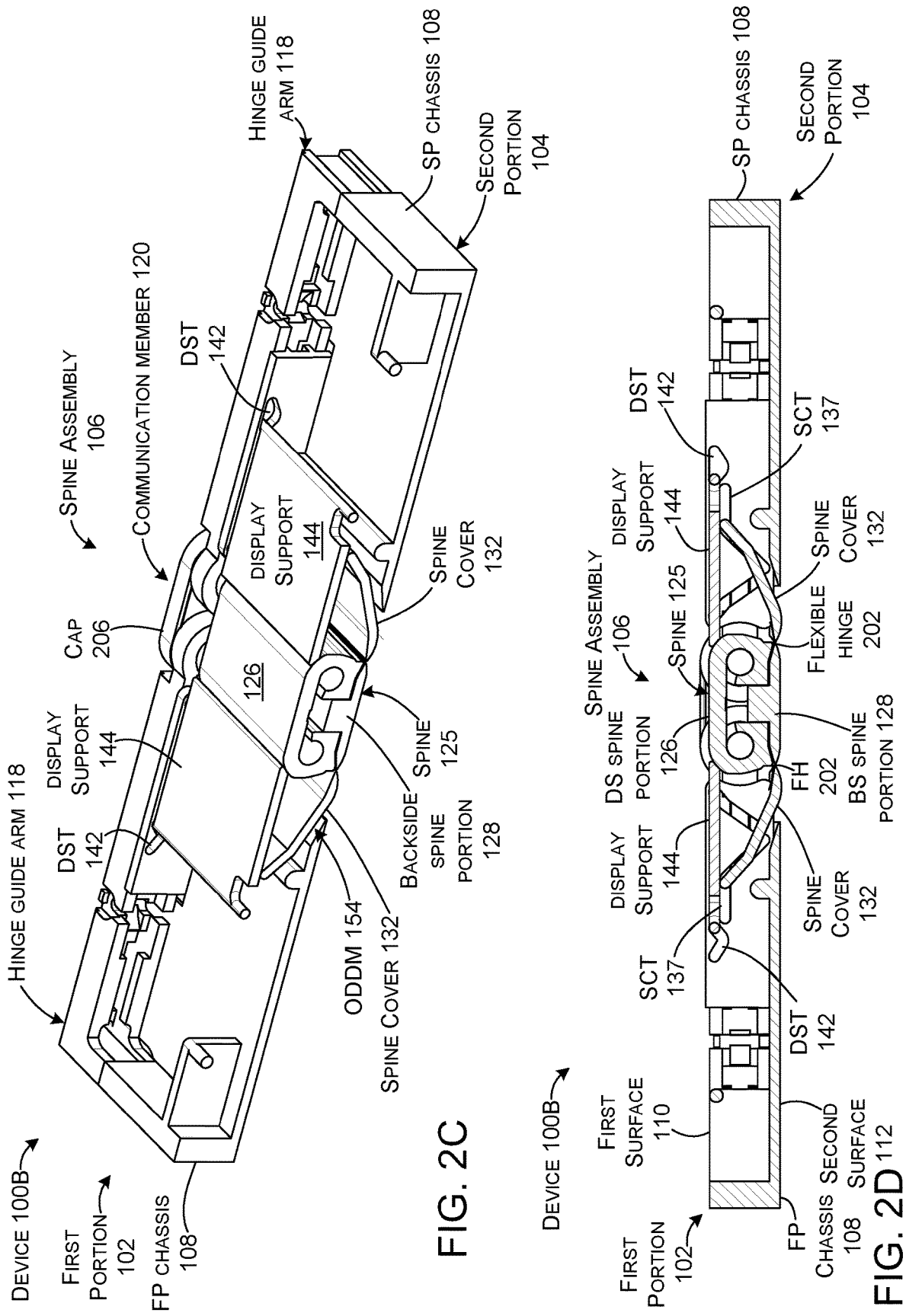

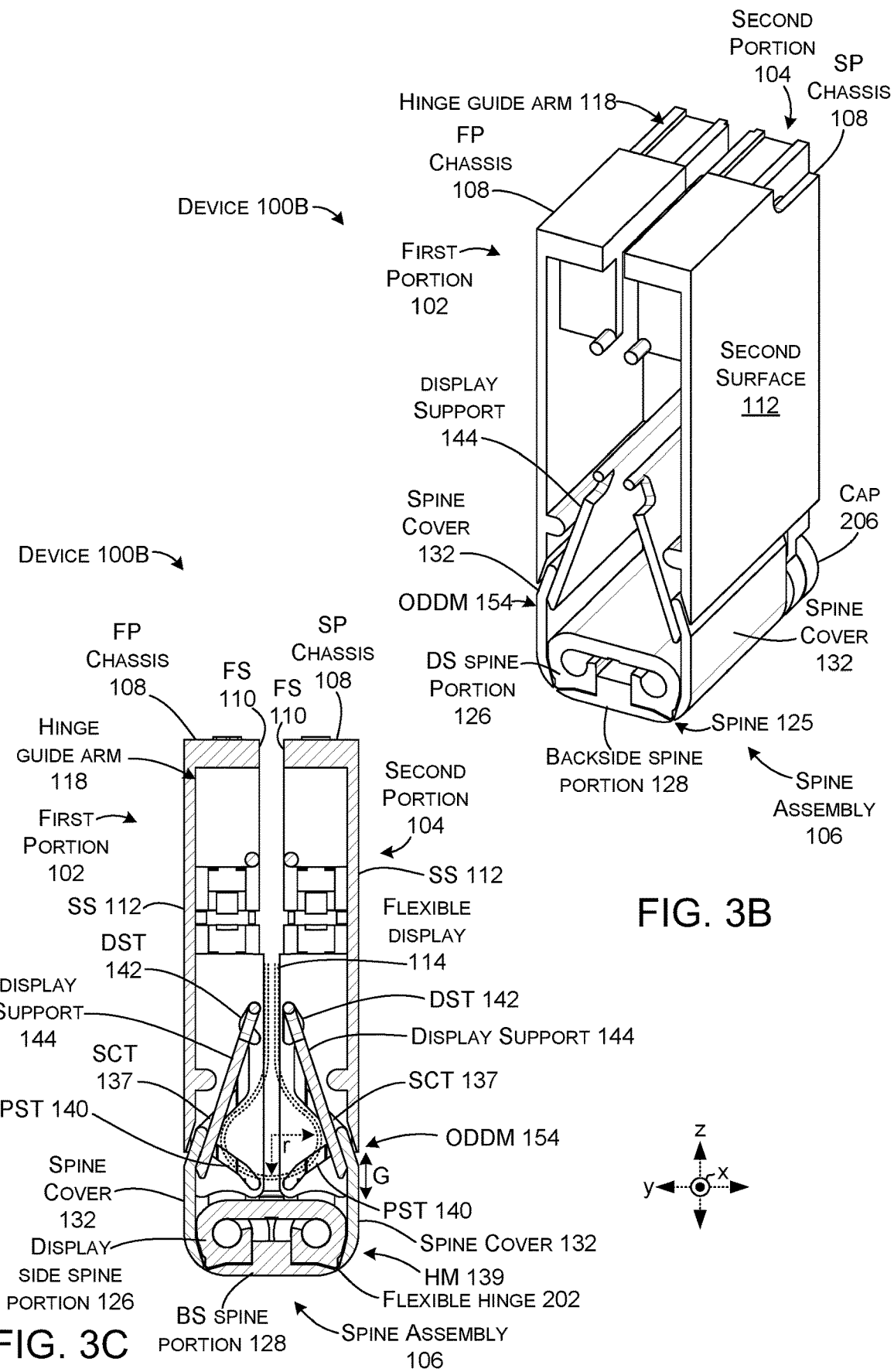

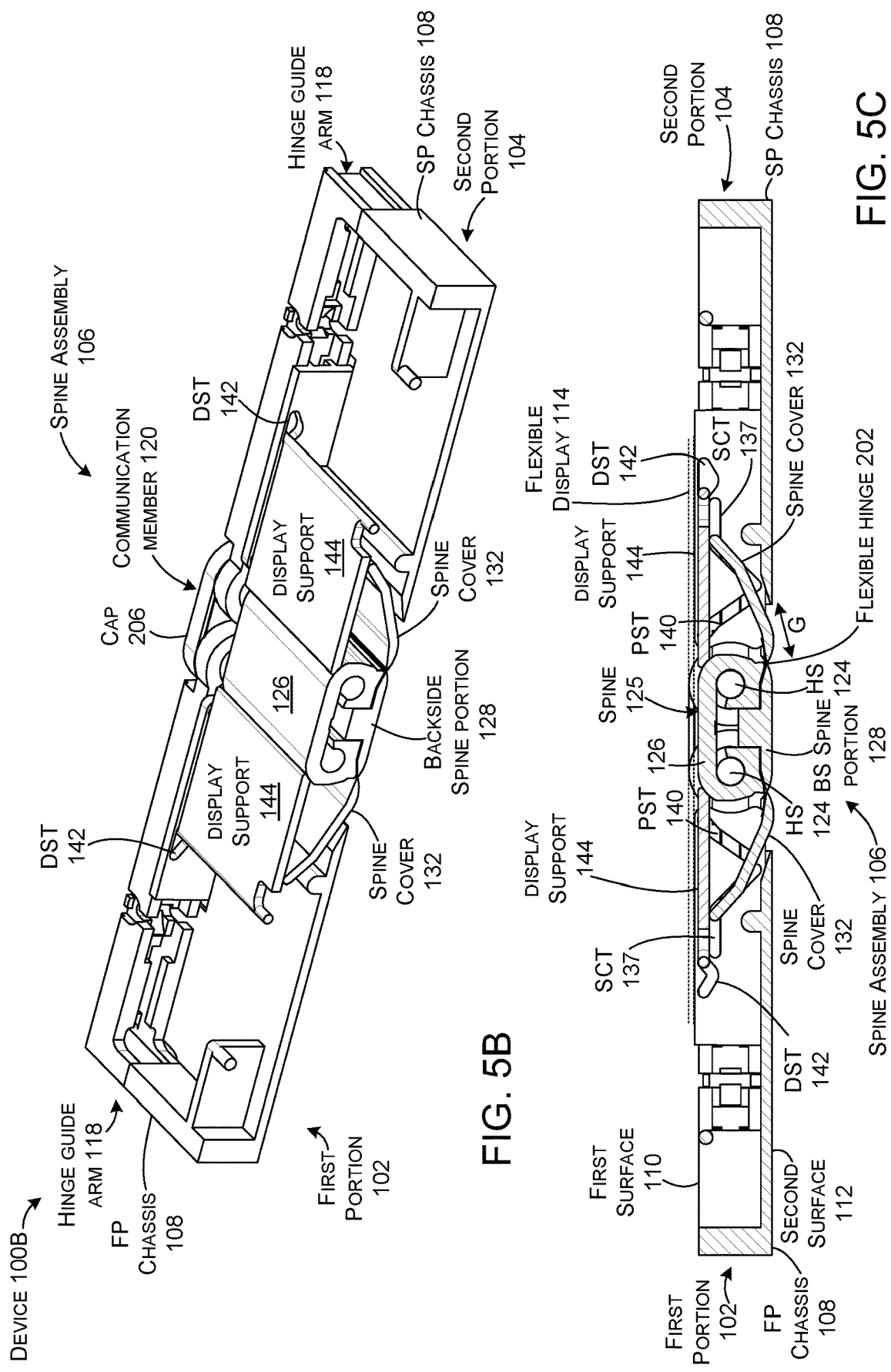

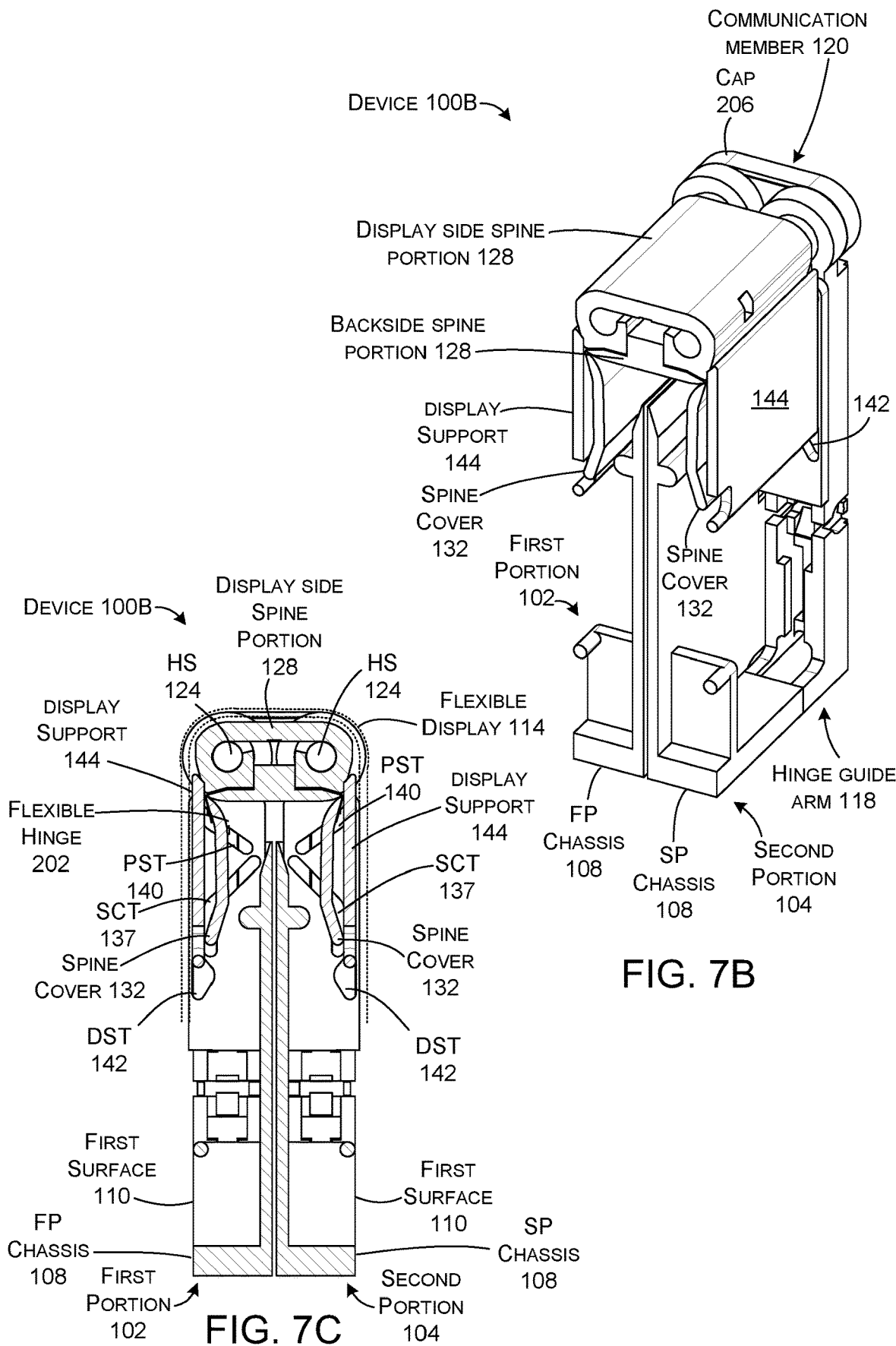

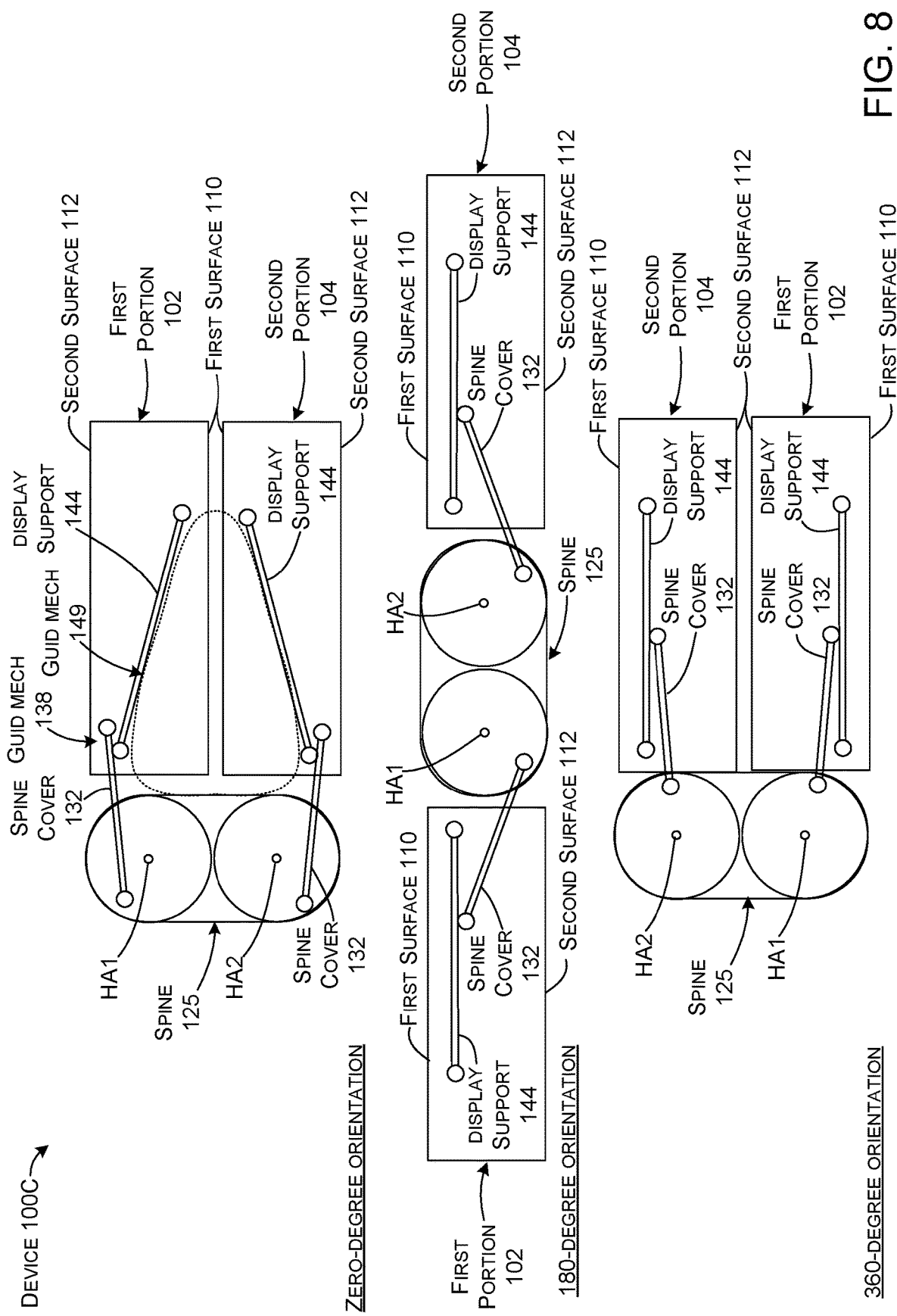

HINGED DEVICE WITH A FLEXIBLE DISPLAY

BACKGROUND

Flexible displays have been greatly anticipated for various applications, such as folding devices. However, adoption has been slow and initial products have experienced reliability issues.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the figure and associated discussion where the reference number is first introduced. Where space permits, elements and their associated reference numbers are both shown on the drawing page for the reader's convenience. Otherwise, only the reference numbers are shown.

FIGS. 1C, 2C, 3B, 4B, 5B, 6B, and 7B show sectioned perspective views of example devices in accordance with some implementations of the present concepts.

FIGS. 1D, 2D, 3C, 4C, 5C, 6C, 7C, and 8 show elevational views of example devices in accordance with some implementations of the present concepts.

SUMMARY

Figure 1A:
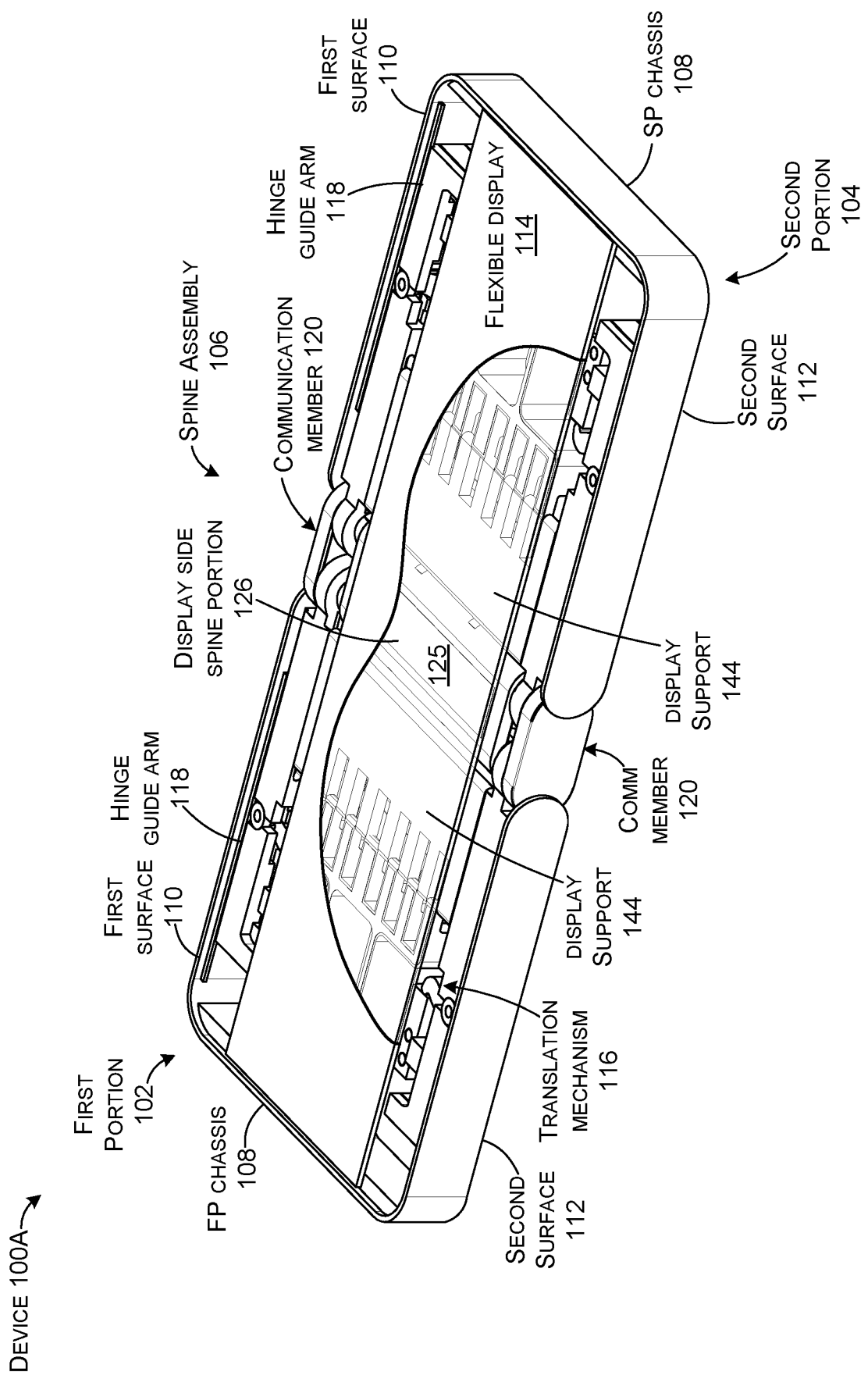
FIGS. 1A, 2A, 3A, 4A, 5A, 6A, and 7A show perspective views of example devices in accordance with some implementations of the present concepts.
Figure 1B:
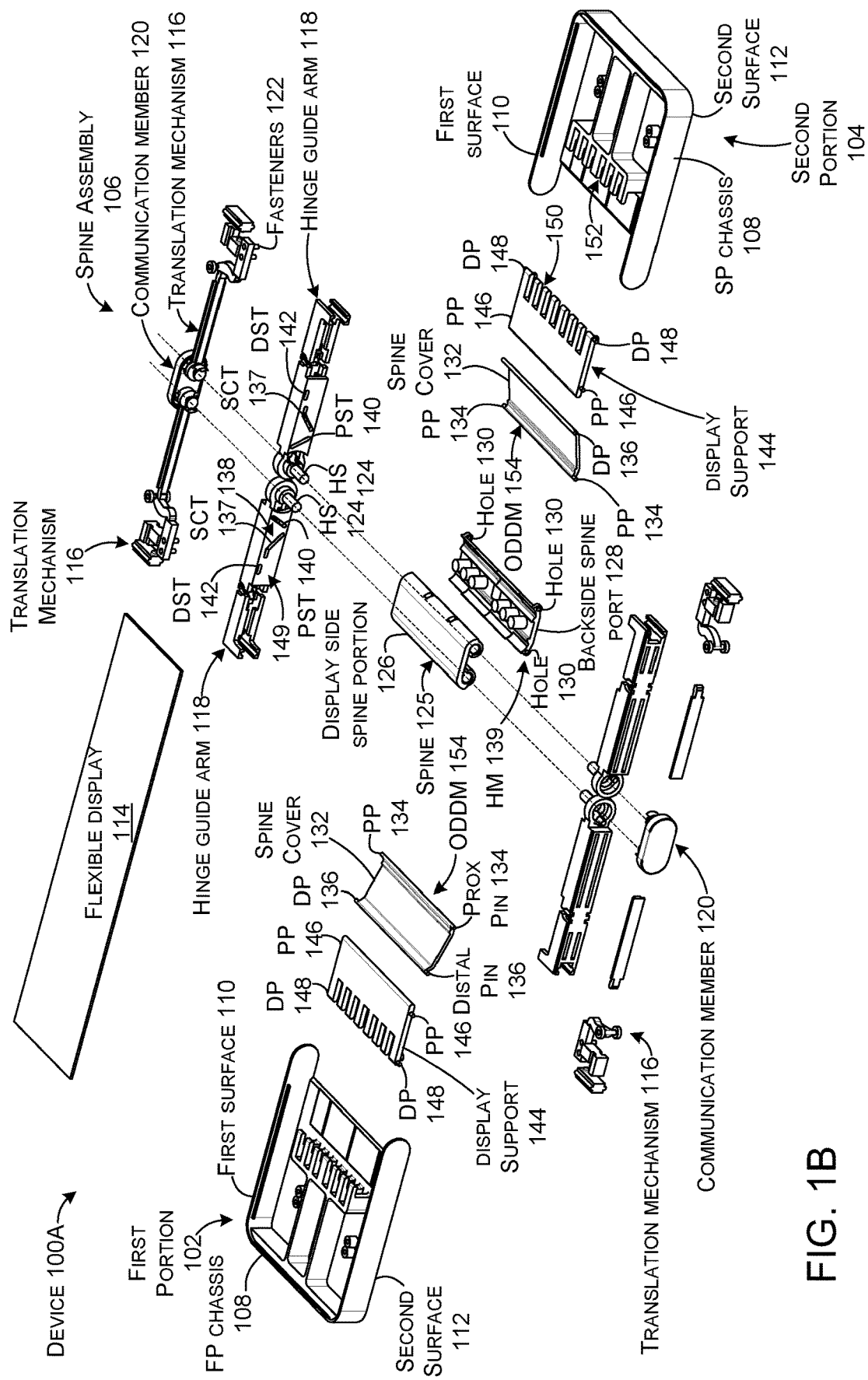
FIGS. 1B and 2B show exploded perspective views of example devices in accordance with some implementations of the present concepts.

This patent relates to hinged devices that have flexible displays. One example has first and second portions rotatably secured at a spine from a closed orientation to an open orientation and a flexible display extending from a surface of the first portion across the spine and over a surface of the second portion. The example can include a track defined in the first portion and a display support positioned in the track. An orientation-dependent drive mechanism can be configured to bias the display support along the track toward the surface to support the flexible display in the open orientation of the first and second portions and to allow the display support to move along the track away from the surface in the closed orientation.

This summary is provided for purposes of providing a brief explanation of some of the concepts described in this patent and is not intended as a complete or limiting description.

DESCRIPTION

The present concepts relate to devices, such as computing devices that include first and second device portions that are coupled at a spine assembly through a range of (angular) rotation, such as from a closed zero-degree orientation to an open orientation, such as 180 degrees or more. A flexible display can span across the spine assembly and be secured to both the first and second portions. When the first and second portions are closed against one another, the device can offer a technical solution for providing extra room at the spine assembly to allow the flexible display to bend without damage by moving the display supports away from the first surfaces. At open orientations, the spine assembly can provide a technical solution for supporting the flexible display to reduce deflection when the user physically engages the flexible display.

Some implementations, such as those that open more than 180 degrees, can translate the first and second portions relative to the spine at different orientations to reduce stress forces on the flexible display (e.g., a length of the device can change rather than 'stretching' or otherwise imparting forces on the flexible display). Pivoting spine covers can be employed between the spine assembly and the first and second portions to cover any gaps that would otherwise occur during the rotation of the first and second portions. During rotation a percentage of the pivoting spine covers that is exposed on the device can change as more or less of the pivoting spine covers extend into the first and second portions. This changing aspect of the pivoting spine covers can drive display supports.

From one perspective, orientation dependent translation of the first and second portions relative to the spine offers a technical solution of reducing forces imparted on the flexible display and hence reducing damage to the flexible display during rotation. The translation can create and/or change gaps between the first and second portions and the spine. The spine covers offer a technical solution of covering and protecting these changing gaps without interfering with the translation by moving farther into or retracting partially out of the first and second portions as the gaps change during rotation.

The display supports can be proximate to the spine assembly and can move away from the flexible display at the closed orientation so that the flexible display can bend with a larger minimum bend radius. As the device is opened, the pivoting spine covers can bias the display supports toward the flexible display to support the flexible display. The display supports provide a technical solution for providing additional support for the flexible display proximate to the spine. The additional support can contribute to the generally uniform 'feel' of the entire flexible display when physically engaged by the user (e.g., when the user contacts the flexible display with a finger or stylus). The support provided by the display supports can also provide a technical solution of reducing any likelihood of the stylus deforming the flexible display to an extent that damages the flexible display. These and other aspects are described below by way of example.

Introductory FIGS. 1A-1D collectively show an example device 100A that has first and second portions 102 and 104 that are rotatably secured together by a hinge assembly or spine assembly 106 and are positioned at a 180-degree orientation. The first portion 102 and the second portion 104 can include chassis 108. The chassis 108 can define first or front surfaces 110 and second or rear surfaces 112. A flexible display 114 can extend from the first surface 110 of the first portion 102, across the spine assembly 106, and onto the first surface 110 of the second portion 104. The flexible display 114 is shown partially cut-away in FIG. 1A to reveal underlying components.

Translation mechanisms 116 and hinge guide arms 118 can be associated with the first and second portion 102 and 104. The translation mechanisms 116 and the hinge guide arms 118 can be secured by communication members 120. The translation mechanisms 116 can also be secured to the first and second portions 102 and 104, such as by fasteners 122. The fasteners can be secured into holes (shown but not specifically designated in FIG. 1B) in the chassis 108.

Translation can occur between the first portion 102 and a corresponding individual hinge guide arm 118 and/or the second portion 104 and corresponding individual hinge guide arm 118. In some implementations, the translation can occur by the hinge guide arms 118 being slidably received in the translation mechanisms 116. The translation mechanisms 116 can include cam multiplier components (shown but not specifically designated) that are rotatably coupled to the hinge guide arms 118 and drive the translation by interacting with a cam surface rigidly attached to the first portion 102 or second portion 104.

The hinge guide arms 118 provide the hinge function between the first and second portions and the spine assembly 106. The hinge guide arms 118 can define hinge shafts 124. The hinge shafts 124 can engage the spine 125. In this case, the spine 125 includes a display side spine portion 126 and a backside spine portion 128. The display side spine portion 126 can receive the hinge shafts 124. The backside spine portion 128 can be secured to the display side spine portion 126. The backside spine portion 128 can also define holes 130. First and second spine covers 132 can define proximate pins 134 and distal pins 136. (The terms proximate and distal are used relative to the spine). The proximate pins 134 can be received in holes 130 to rotatably secure (e.g., pin) the spine covers 132 to the spine 125. The distal pins 136 can be received in spine cover tracks 137 defined by the hinge guide arms 118. The distal pins 136 and spine cover tracks 137 can function as a guidance mechanism 138 that defines a range of positions for the distal ends of the spine covers 132.

The combination of the spine covers' proximate pins 134 and the holes 130 in the backside spine portion 128 creates a hinge mechanism 139 between the spine assembly 106 and the spine covers 132. The description relating to FIGS. 2A-2D explains another implementation where a flexible hinge spans between the hinge assembly and the spine covers to create this hinge mechanism 139. Briefly, the hinge mechanism 139 can maintain the spine cover relative to a point on the spine assembly 106 so that the spine cover can rotate or pivot around this point as the first and second portions are rotated.

In the present implementation, the hinge guide arms 118 can also define proximal support tracks 140 and distal support tracks 142. First and second display supports 144 can define proximal pins 146 and distal pins 148. The proximal pins 146 can be received in proximal support tracks 140 and the distal pins 148 can be received in distal support tracks 142. The distal support tracks 142 may pivotally constrain the distal pins 148 so that the display supports pivot around the distal pins. Alternatively or additionally, the distal support tracks 142 may allow (and define) linear movement of the distal pins 148 and ultimately the distal ends of the display supports. The proximal support tracks 140, distal support tracks 142, proximal pins 146, and/or distal pins 148 can function as a guidance mechanism 149 that define the range of possible positions for the display supports 144.

The display supports 144 can also define fingers or combs 150 that can intermesh with opposing fingers or combs 152 of the chassis 108. The intermeshing fingers support the flexible display 114 while allowing relative movement (e.g., translation) between the display supports 144 and the chassis 108 in a direction toward and away from the spine assembly 106. The flexible display 114 can be collectively supported by the first surface 110 of the first and second portion chassis 108, the intermeshing combs 150 and 152, the display supports 144, and the display side spine portion 126. The intermeshing combs 150 and 152 can collectively contribute to supporting the flexible display 114 in a manner that avoids large unsupported areas so that the tactile feel of the flexible display is essentially uniform on its entire area when engaged by a user with a stylus or finger.

The display supports 144 can be coplanar with the first surfaces 110 in some orientations and can move away, such as pivot away from the first surfaces in other orientations. For instance, the display supports can be coplanar with the first surfaces 110 at the 180-degree orientation to function collectively with the chassis 108 to support the flexible display 114. At other orientations, such as the closed orientation, the display supports 144 can be biased by the flexible display 114 to move away from the first surfaces to provide additional room for the flexible display to bend at a relatively large bend radius at the spine assembly. In some cases, the spine covers 132 can function as orientation-dependent drive mechanisms ODDM 154 that, at least in part, control the position of the display supports 144 based upon an orientation of the first and second portions 102 and 104. This aspect will be discussed in more detail below relative to FIGS. 3A-7C.

FIGS. 2A-2D are similar to FIGS. 1A-1D respectively, and show another example device 100B. Devices 100A and 100B share many of the same components, some of which are not re-introduced here for sake of brevity. Also, the flexible display is not shown in FIGS. 2A-2D to allow other components to be better visualized. Similarly, a central portion of the chassis 108 that in device 100A defined combs 152 is not visualized in this implementation and corresponding combs 150 are not illustrated on the display supports 144. However, these features can be deployed in this implementation as they were in device 100A described above relative to FIGS. 1A-1D. As mentioned above, the intermeshing combs can allow the chassis 108 to translate toward and away from the spine assembly 105 without creating large gaps where the flexible display 114 is unsupported.

In device 100B, hinge mechanism 139 can entail a flexible hinge 202 extending between the spine 125 and the spine covers 132. In some configurations, the flexible hinge 202 can be secured (e.g., sandwiched) between the display side spine portion 126 and the backside spine portion 128 and then secured to the spine covers 132. The flexible hinge 202 can be manifested as a tape hinge, a fabric hinge, and/or a living hinge, among others. The fabric hinge can be formed from a single piece of material, such as a polymer sheet of material, or multiple materials, such as a woven fabric. The flexible display can offer a technical advantage of imparting a hinge function on the spine covers without physical pins and holes connecting the spine covers to the spine. As such, the shape of the spine and/or spine covers does not have to be adapted for these structures. Instead, the flexible display can extend along, and/or be secured to up to, an entirety of the spine and/or spine covers to provide a secure hinge function between them.

Figure 2A:
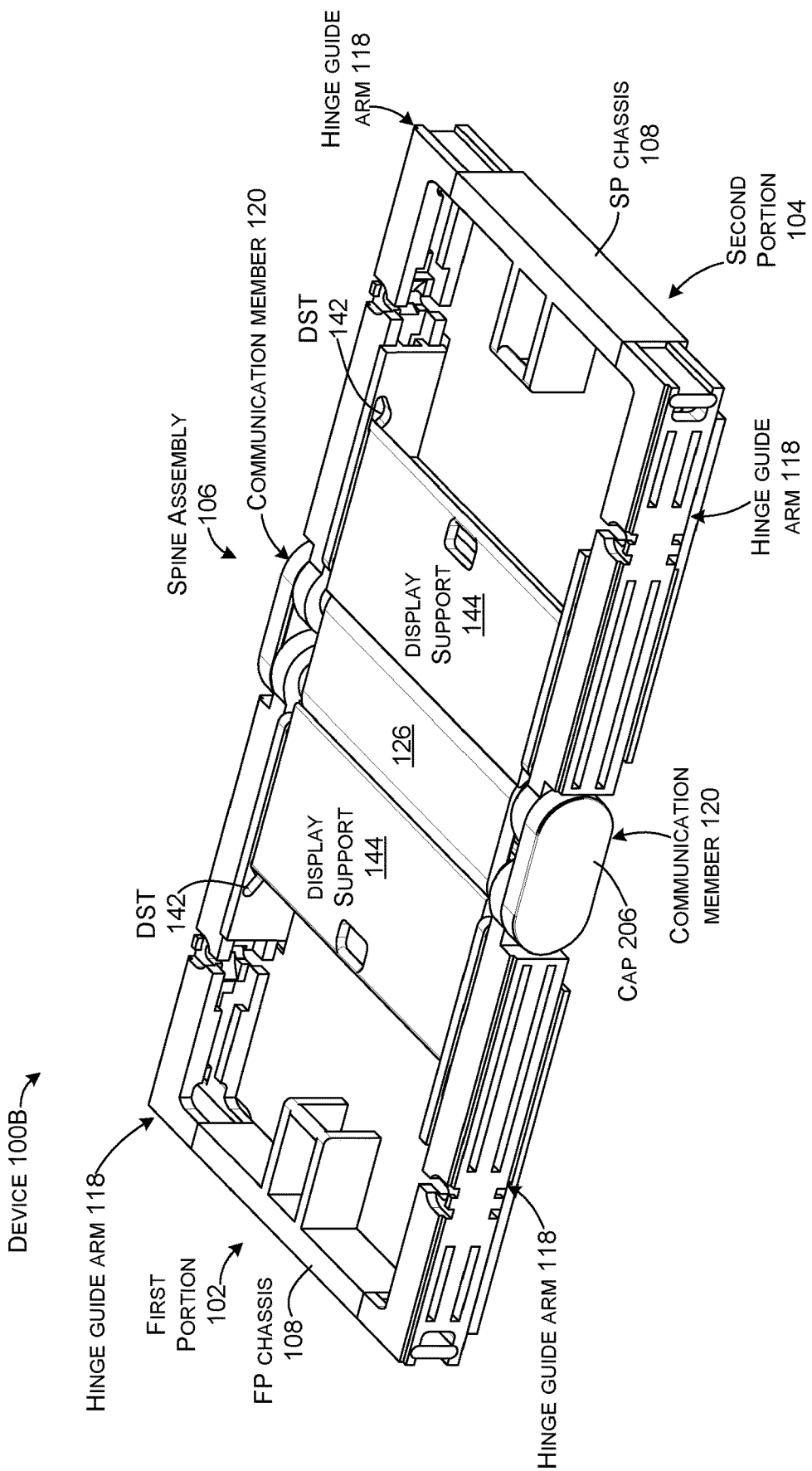
Figure 2B:
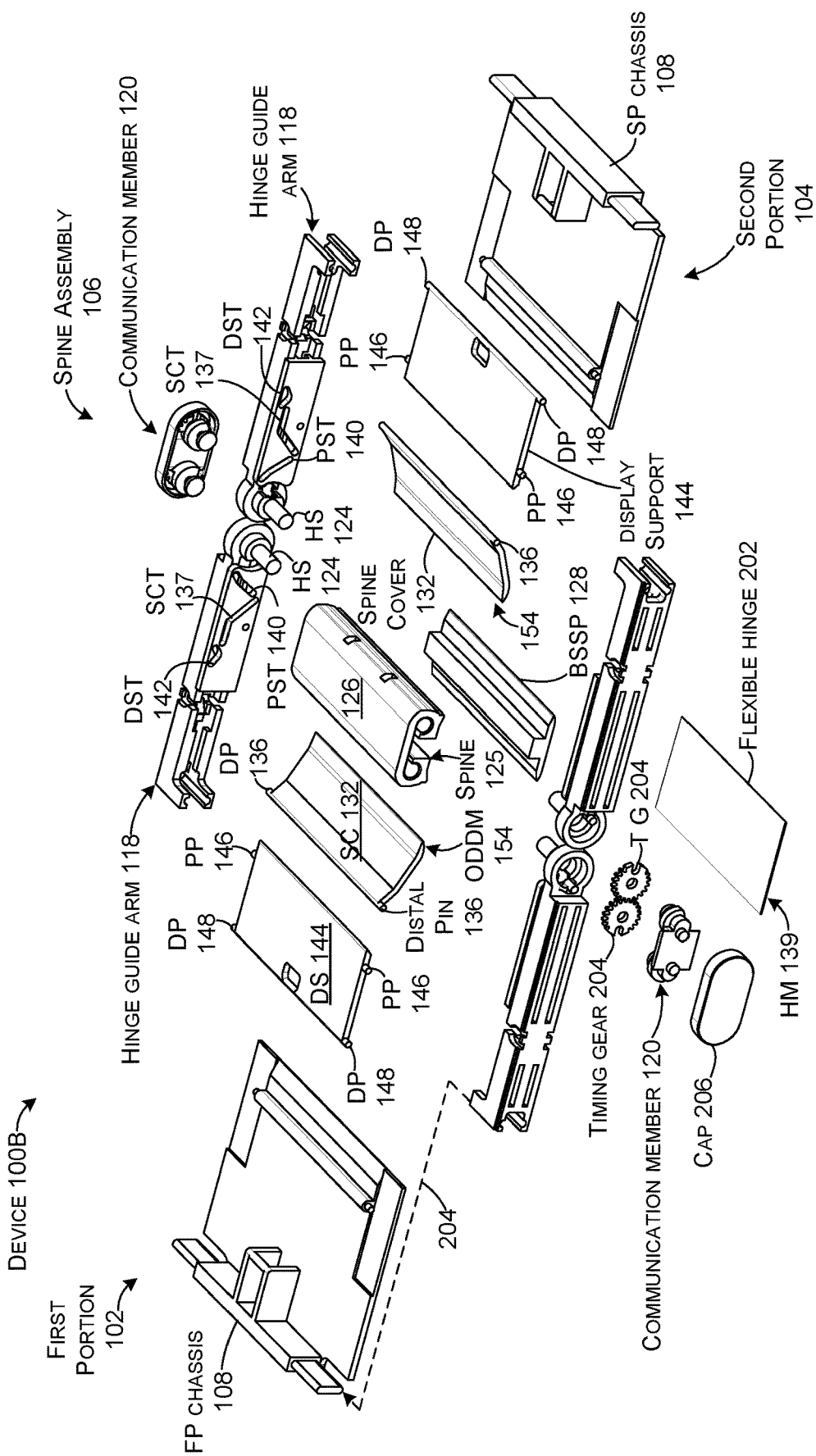

In this implementation, the hinge guide arms 118 are secured to the chassis 108 via tabs on the chassis that are received in slots on the hinge guide arms as indicated at 204 on FIG. 2B. The hinge guide arms 118 define proximal support tracks 140 and distal support tracks 142 that interact with proximal pins 146 and distal pins 148 to define the range of positions of the display supports 144. The hinge guide arms 118 also define the spine cover tracks 137 that define the range of positions of the distal ends of the spine covers 132. These tracks (e.g., proximal support tracks 140, distal support tracks 142, and spine cover tracks 137) along with the hinge mechanisms 139 collectively define the positions of the spine cover 132 and the display supports 144 at various device orientations.

Figure 3A:
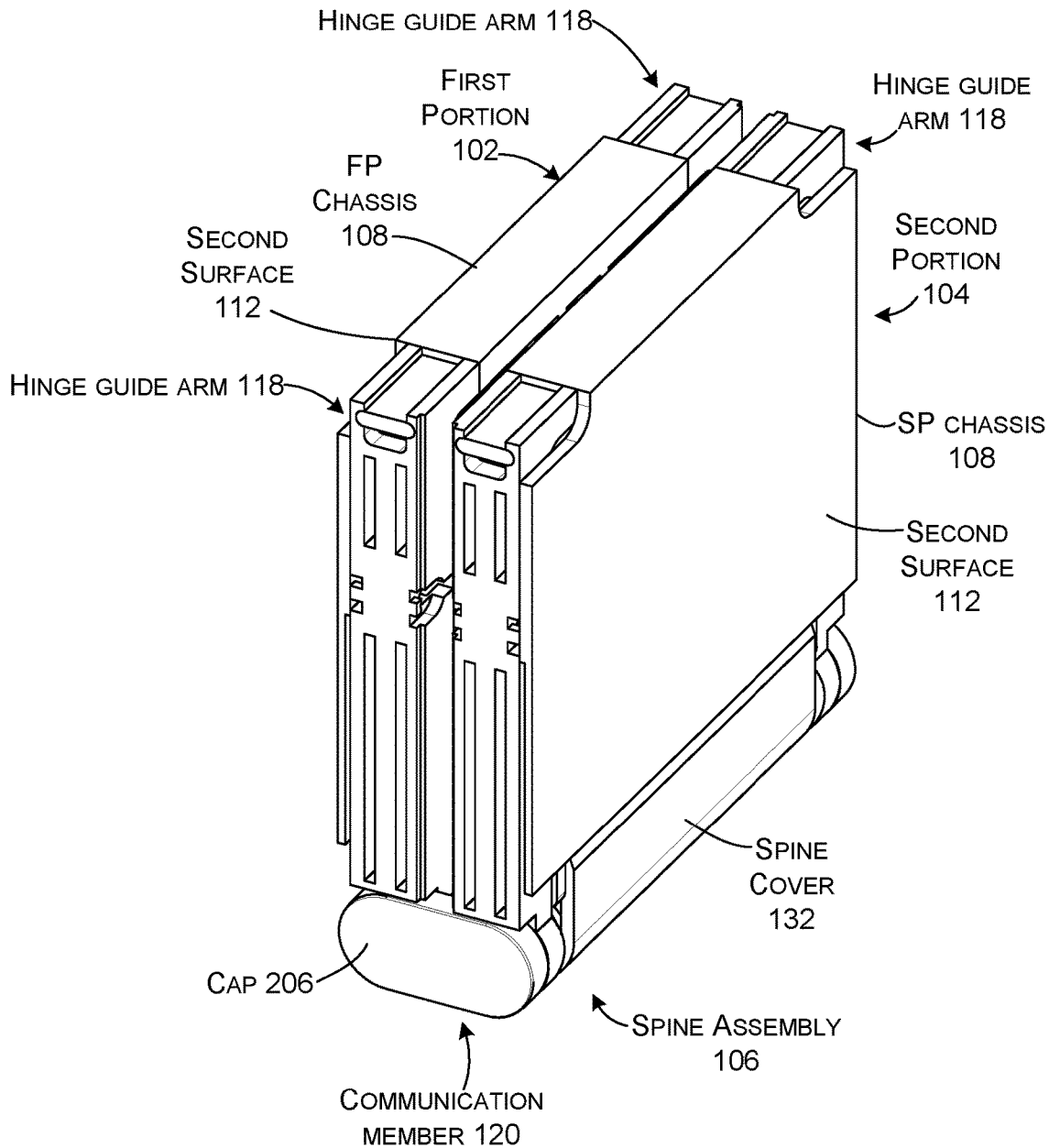
Figure 4A:
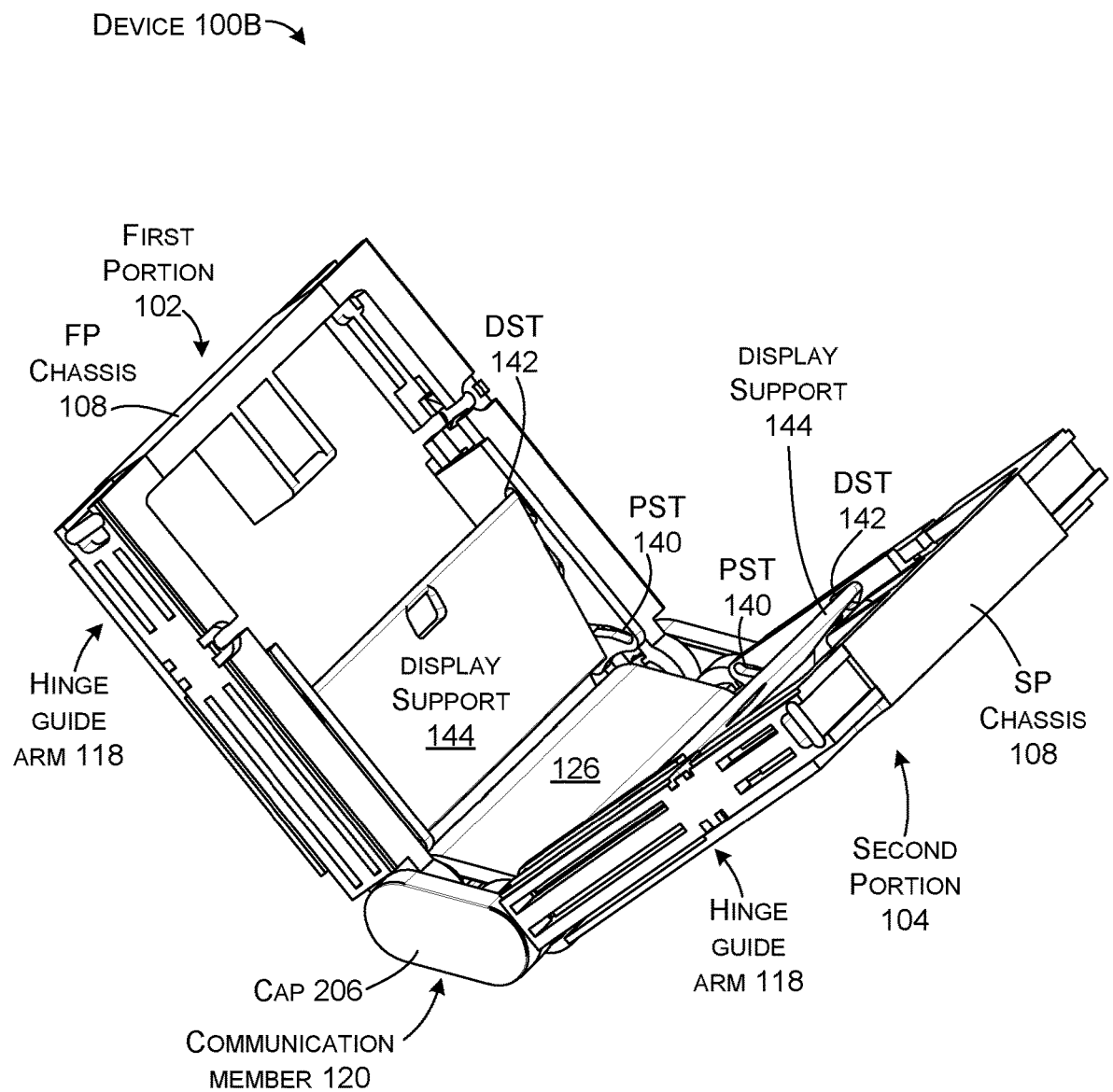
Figure 4B:
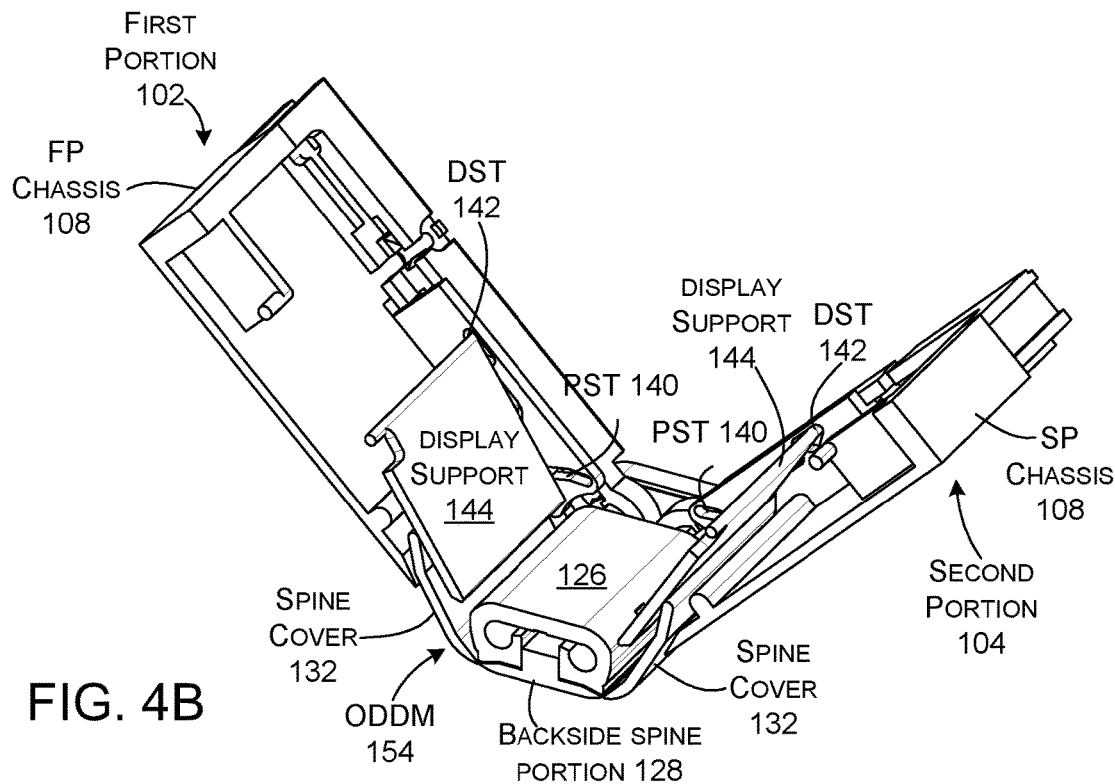
Figure 4C:
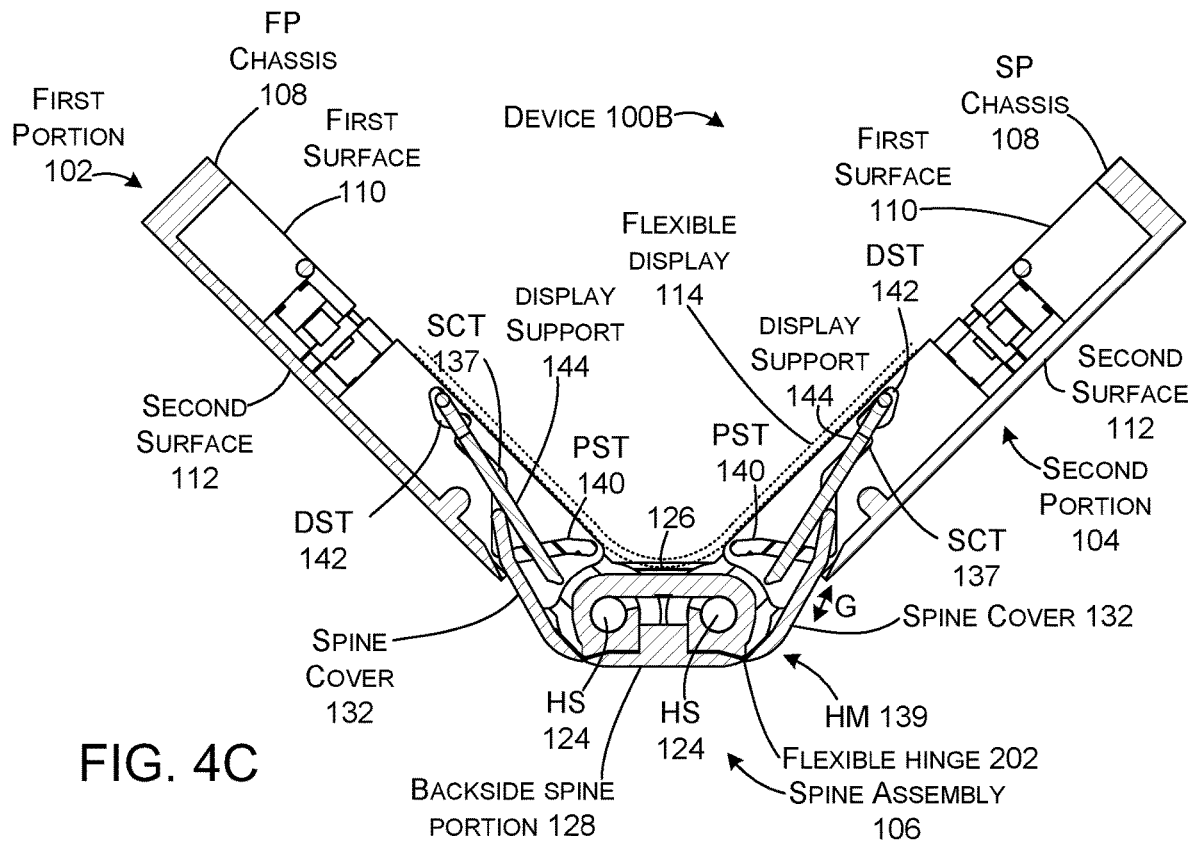
Figure 5A:
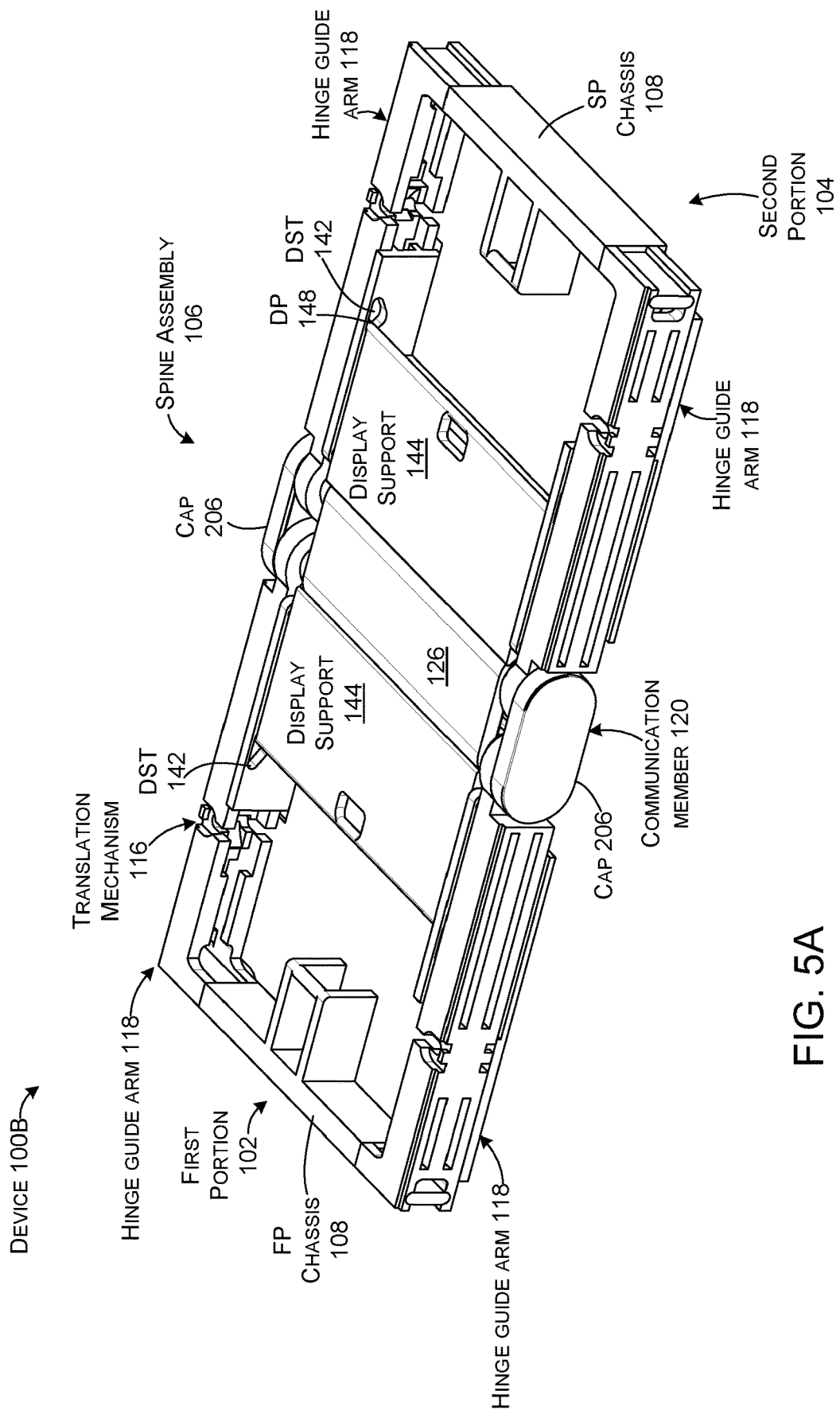
Figure 6A:
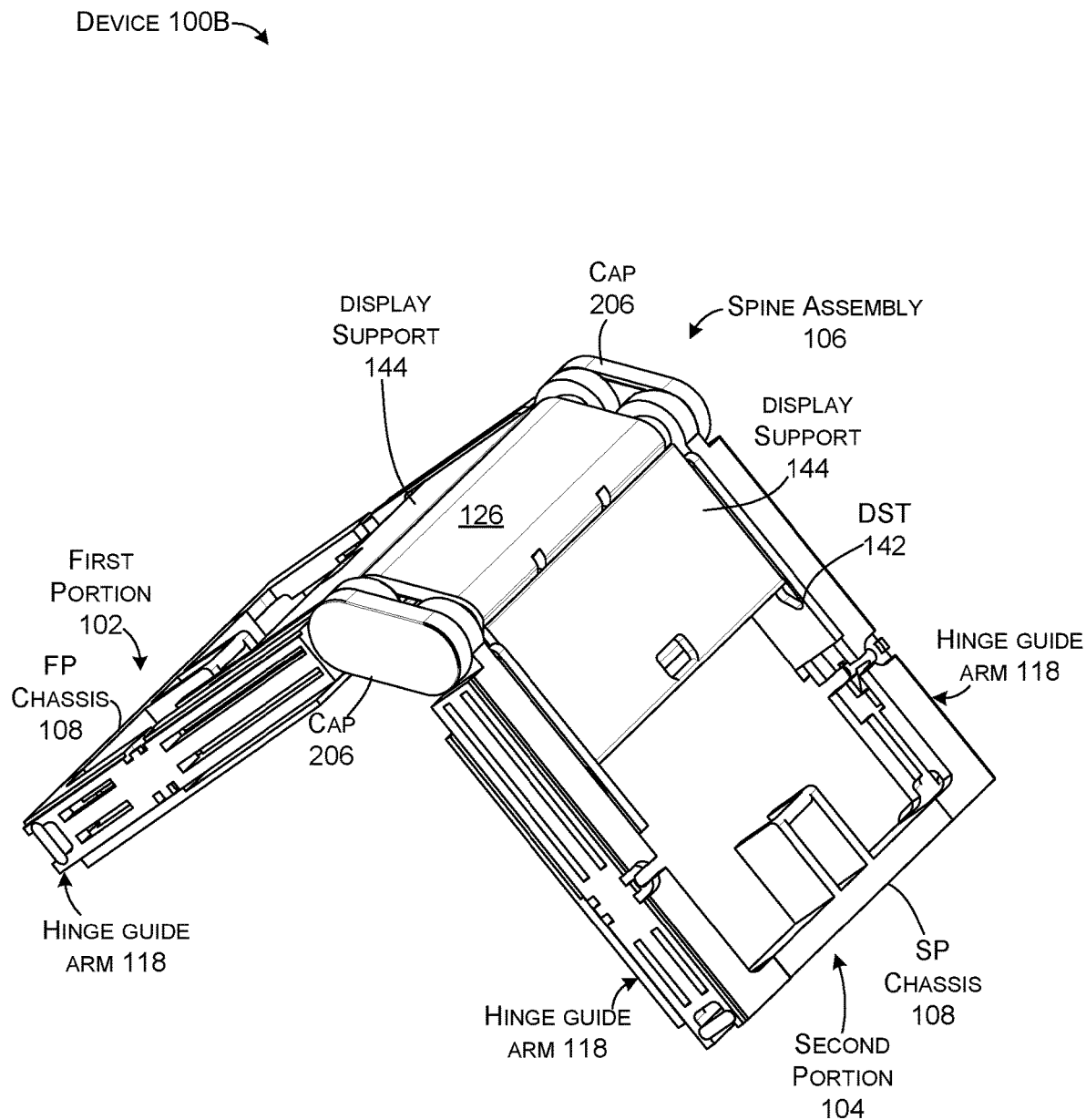
Figure 6B:
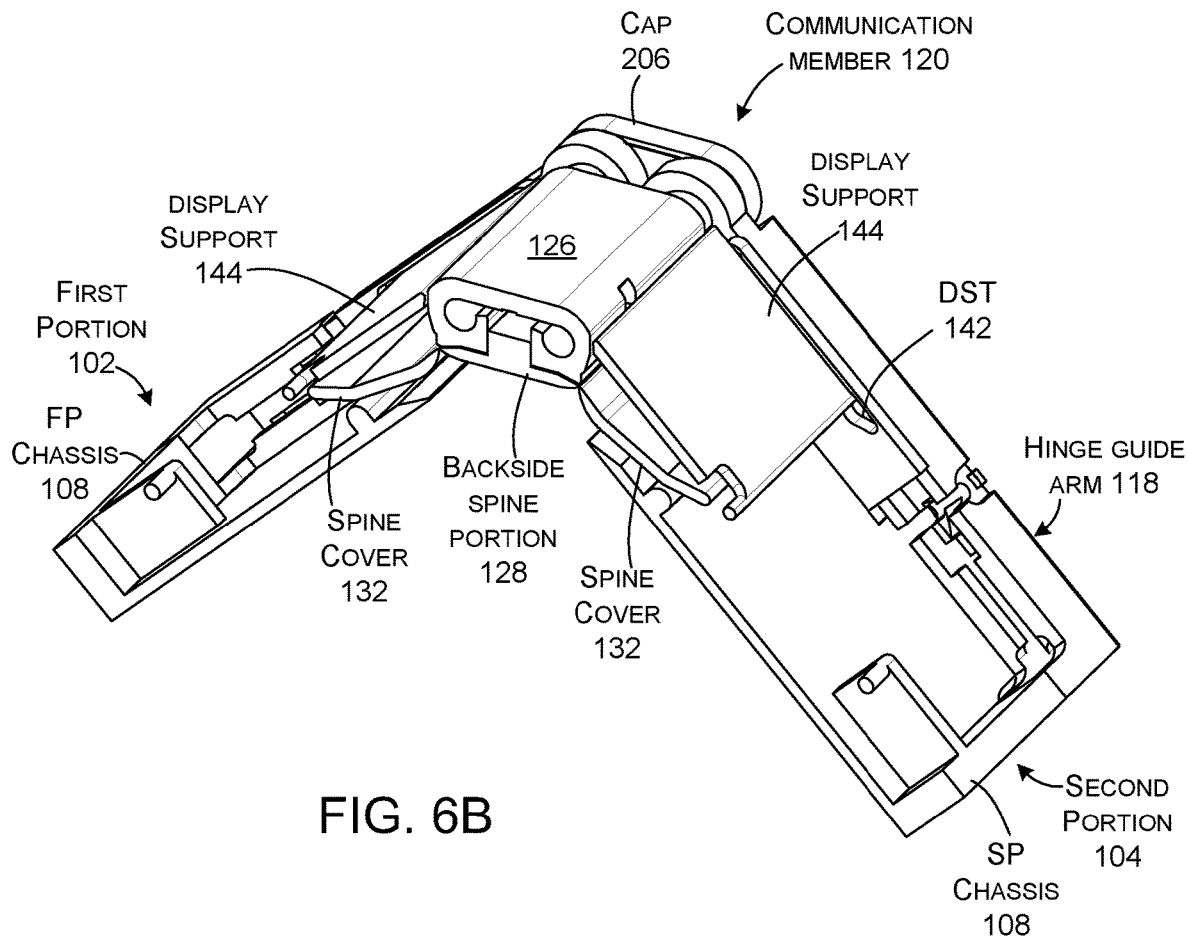
Figure 6C:
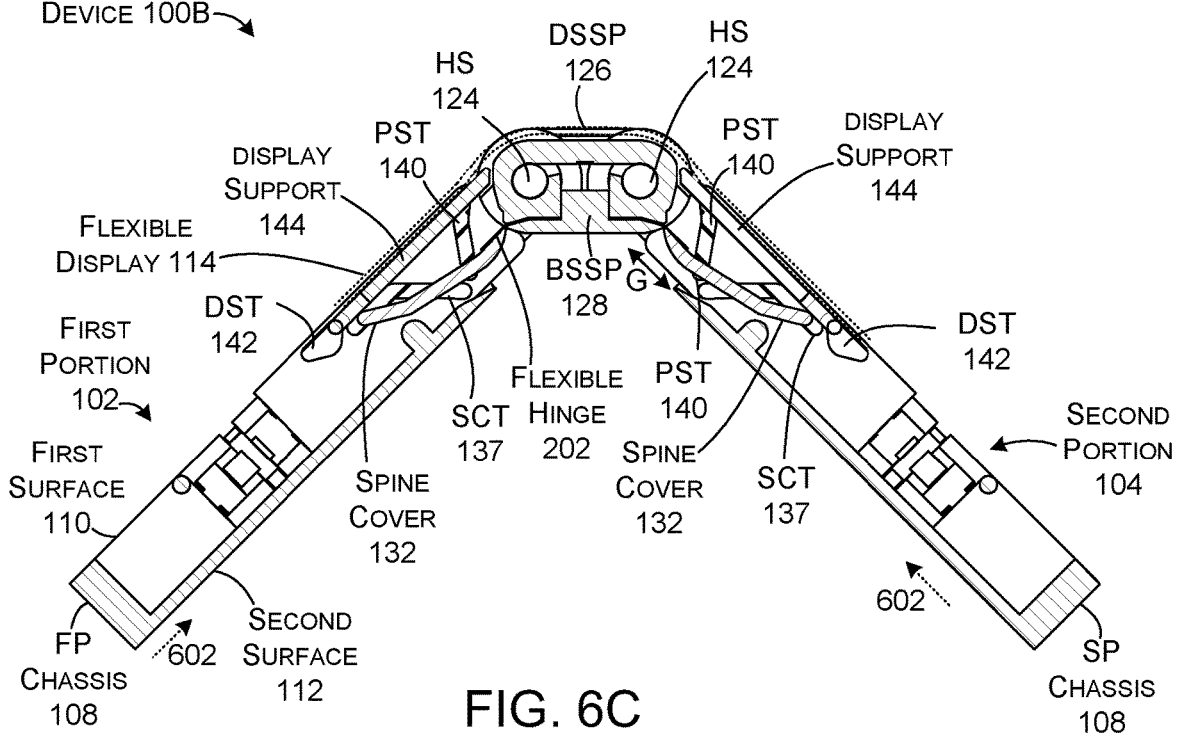
Figure 7A:
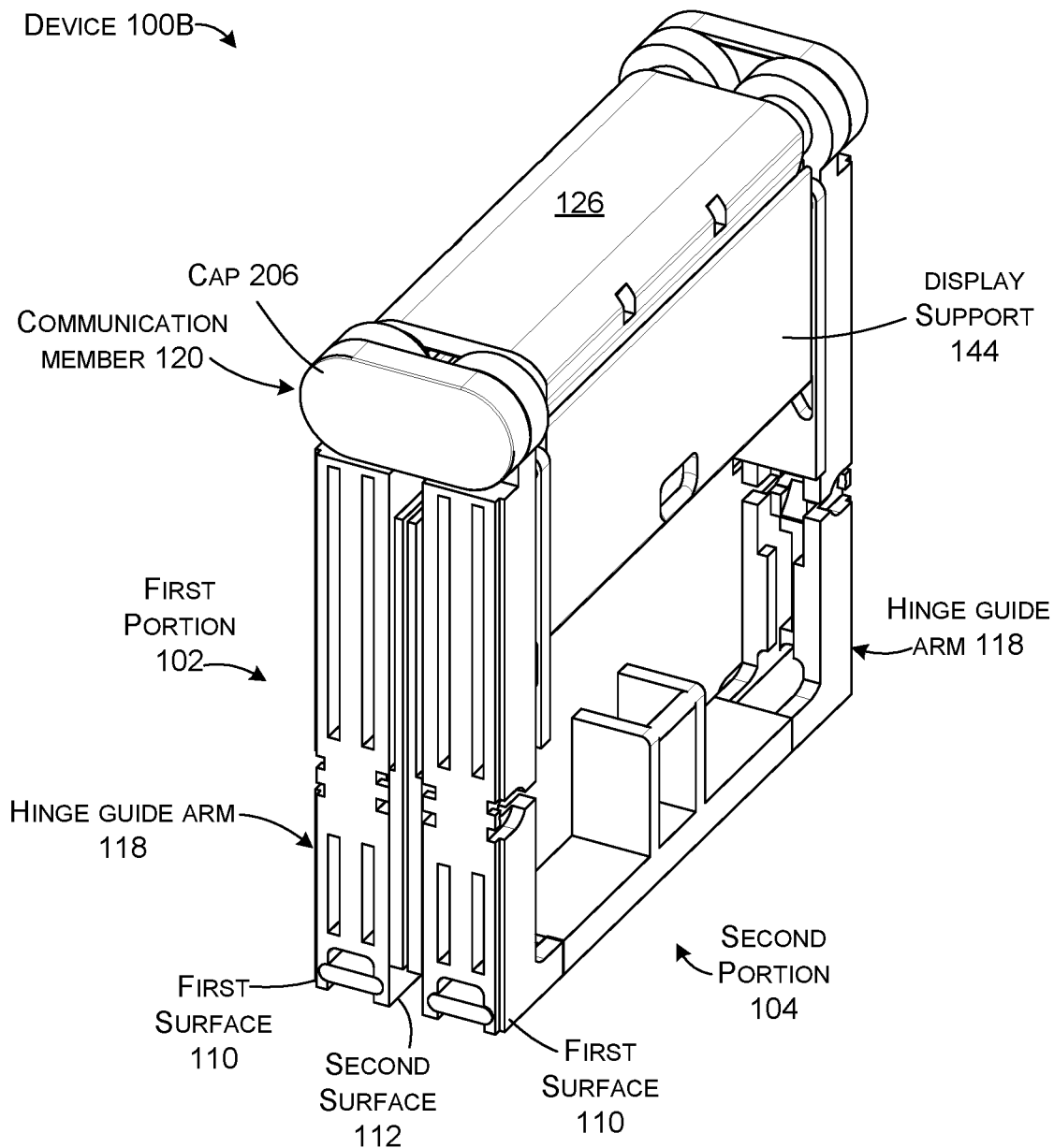

From one perspective, the preceding configuration can be viewed as track-driven display supports. In this implementation the display supports 144 can be driven by the pivoting or hinged spine covers 132 that are hinged relative to the spine 125. The combination of the spine covers and the tracks can move the display supports out of the way at a subset of the range of rotation to allow the flexible display to bend without being damaged and move the display supports toward and against the flexible display in another subset of the range of rotation to support the flexible display when physically engaged by the user. These aspects are described below relative to various representative device orientations. The function of the device 100B is explained at various representative orientations relative to FIGS. 3A-7C that are discussed collectively with FIGS. 1A-1D and 2A-2D. FIGS. 3A-3C show the device at a zero-degree or closed orientation. FIGS. 4A-4C show the device at a 90-degree orientation. FIGS. 5A-5C show the device at a 180-degree orientation. FIGS. 6A-6C show the device at a 270-degree orientation. FIGS. 7A-7C show the device at a 360-degree orientation.

FIGS. 3A-3C show the device 100B with the first and second portions 102 and 104 at a zero-degree orientation. The first surfaces 110 are facing inwardly and the second surfaces 112 are facing outwardly. FIG. 3C shows a central portion of the flexible display 114 positioned on the first surface 110 of the first portion 102, across the spine assembly 106 and onto the first surface 110 of the second portion 104. The flexible display is removed in FIGS. 3A and 3B.

At this closed orientation, the flexible display 114 is forced to bend proximate to the spine assembly 106. Sharp bending can damage the flexible display 114. The bending of the flexible display can create a bias to move the display supports 144 away from the first surfaces 110 proximate to the spine assembly 106. In this implementation, the display supports have moved by pivoting at their distal ends so the display supports define acute angles with the first surface (e.g., the distal ends are close to the first surfaces and the proximal ends are close to the second surfaces). This movement creates space that allows the flexible display 114 to bend in a 'tear drop' shape with a relatively large minimum bend radius r that reduces potential damage to the flexible display 114. For instance, in some implementations, the minimum bend radius can be at least about 50% of a thickness of the first or second portions as measured between, and perpendicular to, the first and second surfaces 110 and 112.

From one perspective, a technical problem associated with foldable devices is sharp bending of the flexible at the spine causing damage to the flexible display. The present concepts provide a technical solution where the display supports move out of the way at the closed orientation to allow more room for the flexible display to bend at the spine (e.g., larger minimum bend radius) and at other orientations the display supports move up against and support the flexible display proximate to the spine.

As mentioned above, the flexible display 114 can be secured to chassis 108 of the first and second portions 102 and 104. To reduce forces imparted on the flexible display during rotation, the first and second chassis 108 can be configured to translate toward and away from the spine assembly 106 during rotation. Stated another way, if the first and second portions were fixed, the pathlength experienced by the flexible display would change through the range of orientations. The translation mechanisms provide a technical solution that addresses this concern by facilitating translation between the first and second portions and the spine so that the pathlength remains generally uniform. This technical solution protects the flexible display from various forces, such as tension and/or compressive forces that would otherwise be imparted on the flexible display through the range of rotation.

At the closed orientation, the first and second chassis 108 are translated relatively farther away from the spine assembly 106. This translation can create a gap G (FIG. 3C) between the first and second chassis 108 and the spine assembly 106. The spine covers 132 can extend between the spine 125 and the chassis 108 to cover this gap G and prevent damage to the device, such as from foreign objects entering the device through the gap. From another perspective, the spine covers 132 can be viewed as bridging the gap between the spine and the first surfaces 110 of the first and second portion to protect the device from foreign materials. Further, the amount or linear percentage of the spine covers that is exposed is configured to change to match the gap G and a remainder of the spine covers can extend into the first and second portions depending on the orientation (e.g., the translation). For instance, at some orientations, such as the closed orientation, a majority of the spine covers may be exposed to cover the gaps when the gaps are larger. This can be seen in FIG. 3C, where a majority of the spine covers 132 are exposed between the spine 125 and the chassis 108 and are coplanar with the rear or second surfaces 112.

At other orientations, a majority of the spine covers 132 may be in the first and second portions 102 and 104 (e.g., between the first and second surfaces), such as when the gaps are smaller. Thus, the spine covers can provide a technical solution for covering varying gaps between the spine and the first surfaces of the first and second portions. The gaps may change with changing orientation, such as because of translation, a change in the approach of the first and second portions to the spine based upon orientation, and/or a shape of the spine adjacent to the first and second portions at various orientations. The technical solution offered by the spine covers can accommodate changes to the gap by extending less or farther into the first and second portions so that more or less of the spine covers are exposed to cover the gap.

Further, in some implementations, the spine covers 132 can function as orientation-dependent drive mechanisms 154 that are configured to bias the display supports 144 toward specific positions as appropriate for various device orientations.

The spine covers 132 can provide a technical solution to the technical problems described above. The spine covers can both control the position of the display supports relative to the orientation of the device and can cover the changing gaps between the spine 125 and the chassis 108. Thus, a single component, the spine covers 132, can solve multiple technical problems to both protect the flexible display from bending too sharply and being damaged and protect the device from environmental hazards that could damage the flexible display and/or other device components and also cause the flexible display to be supported at other orientations.

Recall that as mentioned above relative to FIGS. 1A-2D, the potential range of positions of the display supports 144 are controlled by the proximal support tracks 140 and the distal support tracks 142. The spine covers 132 can contact the display supports 144 to bias them toward a particular position. In turn, the positions of the spine covers 132 can be controlled at the spine 125 by the hinge mechanisms 139 and at the distal ends by spine cover tracks 137.

As shown in FIG. 3C, a relatively large portion of spine covers 132 are positioned along the spines 125 and across the gap G. A relatively small portion of the spine covers are extending into the first and second portions 102 and 104. The distal ends of the spine covers 132 are in the proximal ends of the spine cover tracks toward the second surfaces 112. Similarly, the proximal ends of the display supports 144 are at the extreme ends of the proximal support tracks 140 toward the second surfaces 112. Thus, the spine covers 132 are allowing the flexible display 114 to press outwardly on the display supports 144 to create space for the teardrop bend radius of the flexible display described above. From another perspective, at this orientation, the bias of flexible display 114 on the display supports 144 from the first surface toward the second surface is greater than the bias of the spine covers 132 in the opposite direction. In other orientations, the bias from the spine covers 132 is greater and the display supports are moved toward the first surfaces.

As shown in FIG. 3C relative to second portion 104, the hinge mechanism 139, which in this case is manifest as flexible hinge 202, can maintain the spine covers 132 relative to a fixed point (in a 2D view or a line in a 3D view) on the spine assembly 106. In this case, that point is a junction of the display side spine portion 126 and the backside spine portion 128. As the first and second portions 102 and 104 are rotated through different orientations, the hinge mechanism 139 can maintain this relationship so that the spine covers 132 can pivot around this fixed point while rotating with the first or second portions.

FIGS. 4A-4C show the first and second portions 102 and 104 rotated from the closed orientation of FIGS. 3A-3C to about a 90-degree orientation. FIG. 4C shows a central portion of the flexible display 114 positioned on the first surface 110 of the first portion 102, across the spine assembly 106 and onto the first surface 110 of the second portion 104. The flexible display 114 is removed in FIGS. 4A and 4B.

As the device rotates from the closed-orientation to this 90-degree open orientation, the spine covers 132 pivot around their proximal ends which are secured by flexible hinge 202 (shown on FIG. 4C, removed in FIGS. 4A and 4B). The spine covers 132 continue to extend across gap G and into the respective first and second portions where their distal ends are guided at an angle toward the first surfaces 110. The gap G is changing relative to the closed-orientation of FIGS. 3A-3C as the chassis 108 translate to maintain the path length experienced by the flexible display 114. The spine covers 132 automatically adapt to the changing gap by changing the ratio of a length of the spine cover exposed at the gaps compared to the length of the spine cover that is in the first and second portions, respectively.

At this point in the rotation, the distal ends of the spine covers 132 that are in the first and second portions are beginning to act on display supports 144 and bias the display supports 144 toward the first surfaces 110. The positions of the display supports are defined (or constrained) by their proximal support tracks 140 and distal support tracks 142. The spine covers 132 can bias the display supports within their range of positions defined by the proximal support tracks 140 and distal support tracks 142. The combination of proximal pins 146 with proximal support tracks 140 and distal pins 148 with distal support tracks 142 provides a technical solution for independently defining the range of positions for the proximal ends and distal ends of the display supports.

In this implementation, the distal support tracks 142 define relatively constrained positions that are located adjacent to the first surfaces 110. The proximal support tracks 140, in contrast, extend generally from the respective second surfaces 112 to the first surfaces 110. Recall that at the zero-degree orientation of FIGS. 3A-3C, the display supports were at the second surface ends of the proximal support tracks 140, which allowed room for the flexible display to bend in the teardrop shape described above. Now, the bias of the spine covers 132 is causing the display supports 144 to move along the proximal support tracks and the proximal ends of the display supports 144 are in a mid-range of the proximal support tracks between the first surfaces 110 and the second surfaces 112.

FIGS. 5A-5C show the device 100B after continued rotation to the 180-degree orientation. These views are similar to FIGS. 2A, 2C, and 2D, respectively. At this point, the spine covers 132 continue to provide protection over gaps G between the spine 125 and the first and second portions (e.g., the chassis 108). At this point, the gaps G are decreasing as the chassis 108 translate toward the spine 125. An extent of the spine covers extending into the first and second portions has increased and is guided into position by the spine cover tracks 137.

The distal ends of the spine covers 132 have traveled in spine cover tracks 137 at an angle toward the first surfaces and are now located in portions of the spine cover tracks that are generally parallel to the first surfaces. The spine covers 132 are now biasing the display supports 144 toward and against the first surfaces 110 and supporting the flexible display 114 between the first portion 102 and the display side spine portion 126 and between the second portion 104 and the display side spine portion 126. Note also, that user engagement of the flexible display 114 is expected at this 180-degree orientation. To provide a more rigid support and reduce deflection, the spine cover tracks 137 can transition from the angled portion to the parallel portion slightly before the orientation at which user engagement is expected. In this case, the angled portion of the spine cover tracks can cover rotation from zero degrees to about 170-175 degrees where they transition to the horizontal portion. Transitioning slightly before the expected user engagement can ensure that the spine cover track and spine cover pin combination prevent downward deflection of the spine cover 132 and the display supports 144 when pressed by the user.

In this implementation, deflection of the display supports 144 due to user engagement is also limited by interaction of the proximate end of the display supports 144 with the spine 125. The proximate ends of the display supports are angled relative to the first surfaces 110 rather than being perpendicular to, or parallel to, the first surfaces. Edges of the display side spine portion 126 have a corresponding acute angle so that the proximal ends of the display supports 144 can rest on the edges. This interaction can resist downward movement of the proximate ends of the display supports due to pressure from user engagement of the flexible display. Thus, the shape of the spine cover tracks can prevent downward movement of the distal ends of the display supports 144 and the angled interaction of the distal ends with the spine 125 can prevent downward movement of the distal ends of the display supports. This combination provides a technical solution of supporting the flexible display 114 at specific orientations by creating a rigid underlying surface that resists deflection associated with user engagement, but yet the display supports move to make room for bending of the flexible display at other orientations where user engagement is not expected or possible, such as when the device is closed.

In the 180-degree orientation of FIGS. 5A-5C, the display supports 144 can contribute to the supporting surfaces underlying the flexible display 114. The supporting surfaces can include the first surfaces 110, the display supports 144, and the display side spine portion 126. The supporting surfaces can create a generally uniform feel for the user when the user physically engages the flexible display. Toward this end, the display supports 144 can be substantially parallel to the first surfaces 110, such as within +/−five degrees to parallel to create the generally uniform feel. In some of these implementations, the first surfaces, display supports, and display side spine portion 126 can be precisely parallel and coplanar to one another to create the generally uniform feel.

FIGS. 6A-6C show the device 100B after continued rotation to about 270 degrees from the closed orientation of FIGS. 3A-3C. At this point, the flexible display 114 is wrapping around the display side spine portion 126 and would experience a longer pathway except that the chassis 108 are further translating toward the spine 125 as indicated by arrows 602. This translation contributes at least in part to a decrease in gap G between the chassis 108 and the spine 125. Spine covers 132 continue to cover and protect over the gap G. The gap is smaller and accordingly the spine covers 132 extend into the first and second portion 102 and 104 to a greater extent than at orientations of lower degrees, as shown in FIGS. 3A-5C. The distal ends of the spine covers 132 are maintained close to the first surfaces 110 by the parallel portions of the spine cover tracks 137. This configuration causes the proximal ends of the spine covers to continue to bias the display supports 144 toward the first surfaces 110 where they support the flexible display 114 and to resist downward deflection from user engagement.

FIGS. 7A-7C show the first and second portions 102 and 104 rotated further to approximately the 360-degree orientation with the flexible display and the first surfaces facing outwardly and the second surfaces 112 facing inwardly. At this point, there is little gap G between the chassis 108 and the spine 125 because the chassis 108 have translated toward (and at this point against the spine) to maintain the length of the pathway experienced by the flexible display 114. The spine covers 132 continue to bias the display supports 144 against the first surfaces 110 to support the flexible display 114.

As described above, the proximal support tracks 140 and distal support tracks 142 define the range of positions of the display supports 144. The spine covers 132 can pivot around the spine 125 and drive the display supports 144 to orientation-specific positions. In the closed orientation, the position of the display supports 144 tilts the display supports away from the first surfaces 110 proximate to the spine 125 and allows the flexible display 114 to bend in the teardrop shape illustrated in FIG. 3C. As the device is opened, the spine covers 132 bias the display supports 144 along the support tracks toward the first surface 110 to support the flexible display 114. The spine covers 132 achieve the biasing of the display supports 144 while also covering the gap between the chassis 108 and the spine 125 that changes with the orientation of the first and second portions 102 and 104 due to translation of the chassis 108. The translation of the chassis 108 can maintain a uniform path length for the flexible display 114 through the range of rotation to avoid stress and damage to the flexible display.

Note that the implementations described above employ both spine covers 132 and display supports 144 that operate cooperatively. However, other implementations may employ either of these structures without the other. For instance, spine covers could be employed to cover the gaps between the first and second portions and the spine without display supports. Similarly, display supports could be employed without spine covers. In some of these cases, biasing mechanisms (e.g., driving linkages), such as springs could be employed to bias the display supports toward specific positions. These springs could operate in concert with bias from the flexible display to obtain orientation-specific positioning of the display supports.

FIG. 8 shows another example device 100C in a zero-degree orientation, 180-degree orientation, and 360-degree orientation. In this case, the flexible display, while not shown, can extend on the first surface 110 of the first portion 102, across the spine 125 and on the first surface 110 of the second portion 104. The spine 125 can define two hinge axes (HA1 and HA2). The spine covers 132 can have proximate ends that are at fixed locations relative to the hinge axes and distal ends that extend into the first and second portions 102 and 104, respectively.

Guidance mechanism 138 can define the range of positions for the distal ends of the spine covers 132. Guidance mechanism 149 can define the range of possible positions for the display supports 144.

At the zero-degree orientation, proximal ends of the display supports 144 are located away from the first surfaces 110 and create a bending space 802 available for the flexible display to bend along a gradual arc to avoid damage. The spine covers 132 extend across and protect any gap between the first and second portions 102 and 104 and the spine 125.

At the 180-degree orientation, the first and second portions 102 and 104 have rotated around the spine 125. The spine covers 132 have pivoted around their proximal ends in the spine 125 with the first and second portions. The first and second portions 102 and 104 have also translated toward the spine 125 so that the gaps have decreased. The spine covers 132 continue to protect the gaps. The spine covers 132 have also driven the display supports 144 towards (and against) the first surfaces 110 to contribute to supporting the flexible display 114 with the first surfaces 110. Note that while translating first and second portions can be employed in some implementations, the spine covers 132 can protect the gaps in other implementations that do not translate the first and second portions relative to the spine during rotation.

At the 360-degree orientation, the second surfaces 112 are now facing inwardly. The spine covers 132 protect a decreased gap between the first and second portions 102 and 104 and the spine 125. The spine covers 132 continue to bias the display supports 144 toward the first surfaces 110 to support the flexible display, which would now be wrapped around the outside of the device.

Individual elements of the device 100 and the spine assemblies 106 can be made from various materials, such as metals, plastics, foams, polymers, and/or composites. These materials can be prepared in various ways, such as in the form of sheet metals, die cast metals, machined metals, metal injection moldings, 3D printed materials, molded or 3D printed plastics, and/or molded or 3D printed composites, among others, or any combination of these (and/or other) materials and/or preparations can be employed.

The present hinge assembly concepts can be utilized with any type of device, such as but not limited to notebook computers, smart phones, wearable smart devices, tablets, and/or other types of existing, developing, and/or yet to be developed devices.

Various methods of manufacture, assembly, and/or use for spine assemblies and devices are contemplated beyond those shown above relative to FIGS. 1A-8.

Although techniques, methods, devices, systems, etc., pertaining to spine assemblies are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

Various examples are described above. Additional examples are described below. One example includes a device comprising a first portion secured to rotate relative to a spine assembly and a second portion secured to rotate relative to the spine assembly, a flexible display extending along a front surface of the first portion over the spine assembly to a front surface of the second portion, a first spine cover secured relative to the spine assembly and extending along a rear surface and into the first portion and a second spine cover secured relative to the spine assembly and extending along a rear surface and into the second portion, and an extent to which the first spine cover extends into the first portion and the second spine cover extends into the second portion is configured to be relatively less when the first and second portions are at a zero-degree orientation and relatively more when the first and second portions are at a 180-degree orientation, a first display support pivotally secured in the first portion and configured to be biased toward a position that is substantially parallel to the front surface by the first spine cover in the 180-degree orientation and to transition to a position that forms an acute angle with the front surface at the zero-degree orientation, and, a second display support pivotally secured in the second portion and configured to be biased toward a position that is substantially parallel to the front surface by the second spine cover in the 180-degree orientation and to transition to a position that forms an acute angle with the front surface at the zero-degree orientation.

Another example can include any of the above and/or below examples where substantially parallel comprises plus or minus about five degrees from parallel or wherein substantially parallel comprises parallel.

Another example can include any of the above and/or below examples where the spine assembly includes first and second hinge shafts and wherein a first end of the first spine cover is configured to rotate around the first hinge shaft and a first end of second spine cover is configured to rotate around the second hinge shaft.

Another example can include any of the above and/or below examples where the first end of the first spine cover is pinned to the spine assembly or wherein the first end of the first spine cover is coupled to the spine assembly with a flexible hinge.

Another example can include any of the above and/or below examples where the device further comprises a first hinge guide arm positioned around the first hinge shaft and slidably received in the first portion and a second hinge guide arm positioned around the second hinge shaft and slidably received in the second portion.

Another example can include any of the above and/or below examples where the first hinge guide arm defines first and second tracks configured to guide a position of the first display support at a range of angular orientations including the zero-degree orientation and the 180-degree orientation and the second hinge guide arm defines first and second tracks configured to guide a position of the second display support at the range of angular orientations including the zero-degree orientation and the 180-degree orientation.

Another example can include any of the above and/or below examples where the device further comprises a first translation mechanism positioned to act on the first portion and the first hinge guide arm to bias the first portion toward the spine assembly and a second translation mechanism positioned to act on the second portion and the second hinge guide arm to bias the second portion toward the spine assembly.

Another example can include any of the above and/or below examples where the bias of the first translation mechanism translates the first portion toward the spine assembly at the 180-degree angular orientation and the bias of the second translation mechanism translates the second portion toward the spine assembly at the 180-degree angular orientation.

Another example can include any of the above and/or below examples where at the zero-degree orientation a majority of the first spine cover is coplanar with a rear surface of the first portion and a majority of the second spine cover is coplanar with a rear surface of the second portion.

Another example can include any of the above and/or below examples where at the 180-degree orientation a majority of the first spine cover is between the rear surface and the front surface of the first portion and a majority of the second spine cover is between the rear surface and the front surface of the second portion.

Another example can include any of the above and/or below examples where the first display support defines a comb that is configured to intermesh with an opposing comb defined by the first portion to collectively define at least a portion of the front surface of the first portion and the second display support defines a comb that is configured to intermesh with an opposing comb defined by the second portion to collectively define at least a portion of the front surface of the second portion.

Another example can include any of the above and/or below examples where an extent of the intermesh between the comb of the first display support and the opposing comb of the first portion is defined at least in part by the orientation and an extent of the intermesh between the comb of the second display support and the opposing comb of the second portion is defined at least in part by the orientation.

Another example can include a device comprising a first portion hingedly secured along a spine and a second portion hingedly secured along the spine, and, a first spine cover secured relative to the spine and extending into the first portion and a second spine cover secured relative to the spine and extending into the second portion, and an extent to which the first spine cover extends into the first portion and the second spine cover extends into the second portion is controlled by an angular orientation of the first and second portions.

Another example can include any of the above and/or below examples where the device further comprises a flexible hinge that couples the first spine cover and the second spine cover to the spine.

Another example can include any of the above and/or below examples where the flexible hinge comprises a woven fabric or a polymer sheet.

Another example can include any of the above and/or below examples where the first spine cover is configured to bridge between the spine and a surface of the first portion and the second spine cover is configured to bridge between the spine and a surface of the second portion.

Another example can include any of the above and/or below examples where the surface of the first portion comprises a rear surface of the first portion and the surface of the second portion comprises a rear surface of the second portion, and further comprising a flexible display positioned across front surfaces of the first and second portions and the spine and further comprising a first display support in the first portion and a second display support in the second portion.

Another example can include any of the above and/or below examples where at a 180-degree angular orientation between the first and second portions, the first and second spine covers are configured to bias the first and second display supports into a coplanar position to the front surfaces of the first and second portions.

Another example can include any of the above and/or below examples where at a zero-degree orientation between the first and second portions, the first and second spine covers are configured to allow the first and second display supports to pivot away from the front surfaces of the first and second portions to provide an increased bend radius for the flexible display.

Another example can include a device comprising first and second portions rotatably secured at a spine from a closed orientation to an open orientation, a flexible display extending from a surface of the first portion across the spine and over a surface of the second portion, a track defined in the first portion, a display support positioned in the track, and, an orientation-dependent drive mechanism that is configured to bias the display support along the track toward the surface to support the flexible display in the open orientation of the first and second portions and to allow the display support to move along the track away from the surface in the closed orientation.

Another example can include any of the above and/or below examples where the orientation-dependent drive mechanism comprises a spine cover that extends between the spine and the first portion.

The invention claimed is:

1. A device, comprising:
   a first portion secured to rotate relative to a spine assembly and a second portion secured to rotate relative to the spine assembly;
   a flexible display extending along a front surface of the first portion over the spine assembly to a front surface of the second portion;
   a first spine cover secured relative to the spine assembly and extending along a rear surface and into the first portion and a second spine cover secured relative to the spine assembly and extending along a rear surface and into the second portion, and an extent to which the first spine cover extends into the first portion and the second spine cover extends into the second portion is configured to be relatively less when the first and second portions are at a zero-degree orientation and relatively more when the first and second portions are at a 180-degree orientation;
   a first display support having an end pivotally secured in the first portion and configured to be biased toward a position that is substantially parallel to the front surface by the first spine cover in the 180-degree orientation and to transition to a position that forms an acute angle with the front surface at the zero-degree orientation; and,
   a second display support having an end pivotally secured in the second portion and configured to be biased toward a position that is substantially parallel to the front surface by the second spine cover in the 180-degree orientation and to transition to a position that forms an acute angle with the front surface at the zero-degree orientation.

2. The device of claim 1, wherein the spine assembly includes first and second hinge shafts and wherein a first end of the first spine cover is configured to rotate around the first hinge shaft and a first end of second spine cover is configured to rotate around the second hinge shaft.

3. The device of claim 2, wherein the first end of the first spine cover is pinned to the spine assembly or wherein the first end of the first spine cover is coupled to the spine assembly with a flexible hinge.

4. The device of claim 2, further comprising a first hinge guide arm positioned around the first hinge shaft and slidably received in the first portion and a second hinge guide arm positioned around the second hinge shaft and slidably received in the second portion.

5. The device of claim 4, wherein the first hinge guide arm defines first and second tracks configured to guide a position of the first display support at a range of angular orientations including the zero-degree orientation and the 180-degree orientation and the second hinge guide arm defines first and second tracks configured to guide a position of the second display support at the range of angular orientations including the zero-degree orientation and the 180-degree orientation.

6. The device of claim 4, further comprising a first translation mechanism positioned to act on the first portion and the first hinge guide arm to bias the first portion toward the spine assembly and a second translation mechanism positioned to act on the second portion and the second hinge guide arm to bias the second portion toward the spine assembly.

7. The device of claim 6, wherein the bias of the first translation mechanism translates the first portion toward the spine assembly at the 180-degree orientation and the bias of the second translation mechanism translates the second portion toward the spine assembly at the 180-degree orientation.

8. The device of claim 1, wherein at the zero-degree orientation a majority of the first spine cover is coplanar with a rear surface of the first portion and a majority of the second spine cover is coplanar with a rear surface of the second portion.

9. The device of claim 8, wherein at the 180-degree orientation a majority of the first spine cover is between the rear surface and the front surface of the first portion and a majority of the second spine cover is between the rear surface and the front surface of the second portion.

10. The device of claim 1, wherein the first display support defines a comb that is configured to intermesh with an opposing comb defined by the first portion to collectively define at least a portion of the front surface of the first portion and the second display support defines a comb that is configured to intermesh with an opposing comb defined by the second portion to collectively define at least a portion of the front surface of the second portion.

11. The device of claim 10, wherein an extent of the intermesh between the comb of the first display support and the opposing comb of the first portion is defined at least in part by the orientation and an extent of the intermesh between the comb of the second display support and the opposing comb of the second portion is defined at least in part by the orientation.

12. A device, comprising:
   a first portion hingedly secured along a spine and a second portion hingedly secured along the spine, the first portion and the second portion defining front surfaces over which a flexible display extends;
   a first spine cover secured relative to the spine and extending into the first portion and a second spine cover secured relative to the spine and extending into the second portion, and an extent to which the first spine cover extends into the first portion and the second spine cover extends into the second portion is controlled by an angular orientation of the first and second portions;
   a first display support having a first end pivotally secured to the first portion and a second end proximate to the spine and the extent to which the first spine cover extends into the first portion determines an extent to which the first spine cover biases the first display support toward the front surface of the first portion; and,
   a second display support having a first end pivotally secured to the second portion and a second end proximate to the spine and the extent to which the second spine cover extends into the second portion determines an extent to which the second spine cover biases the second display support toward the front surface of the second portion.

13. The device of claim 12, further comprising a flexible hinge that couples the first spine cover and the second spine cover to the spine.

14. The device of claim 13, wherein the flexible hinge comprises a woven fabric or a polymer sheet.

15. The device of claim 14, wherein the first spine cover is configured to bridge between the spine and a rear surface of the first portion and the second spine cover is configured to bridge between the spine and a rear surface of the second portion.

16. The device of claim 15, further comprising a flexible display positioned across the front surfaces of the first and second portions and the spine.

17. The device of claim 16, wherein at a 180-degree orientation between the first and second portions, the first and second spine covers are configured to bias the first and second display supports into a coplanar position to the front surfaces of the first and second portions.

18. The device of claim 17, wherein at a zero-degree orientation between the first and second portions, the first and second spine covers are configured to allow the first and second display supports to pivot away from the front surfaces of the first and second portions to provide an increased bend radius for the flexible display.

19. A device, comprising:
   first and second portions rotatably secured at a spine from a closed orientation to an open orientation;
   a flexible display extending from a surface of the first portion across the spine and over a surface of the second portion;
   a track defined in the first portion;
   a first end of a display support positioned in the track; and,
   a spine cover that extends from the spine into the first portion and that is configured to bias the display support along the track toward the surface to support the flexible display in the open orientation of the first and second portions and to allow the display support to move along the track and to pivot around the first end away from the surface in the closed orientation.

20. The device of claim 19, further comprising a second track defined in the second portion and a first end of a second display support positioned in the second track and a second spine cover that extends from the spine into the second portion and that is configured to bias the second display support along the second track toward the surface to support the flexible display in the open orientation of the first and second portions and to allow the second display support to move along the second track and to pivot around the first end away from the surface in the closed orientation.

* * * * *